United States Patent

Schädeli et al.

Patent Number: 6,120,944
Date of Patent: Sep. 19, 2000

[54] HIGHLY TRANSPARENT, COLOR-PIGMENTED HIGH MOLECULAR WEIGHT MATERIAL

[75] Inventors: Ulrich Schädeli, Hockessin, Del.; Eric Tinguely, Fribourg, Switzerland; Véronique Hall-Goulle, Reinach, Switzerland; Heinz Wolleb; Zhimin Hao, both of Marly, Switzerland; Abul Iqbal, Arconciel, Switzerland

[73] Assignee: Ciba Specialty Chemicals Corporation, Tarrytown, N.Y.

[21] Appl. No.: 09/057,089

[22] Filed: Apr. 8, 1998

[30] Foreign Application Priority Data

Apr. 9, 1997 [CH] Switzerland ............... 822/97

[51] Int. Cl.$^7$ ............ G02B 5/20; G02F 1/1335; G03C 1/73
[52] U.S. Cl. ............... 430/7; 430/17; 430/18; 430/270.1
[58] Field of Search ............... 430/7, 17, 18, 430/270.1

[56] References Cited

U.S. PATENT DOCUMENTS

| | | | |
|---|---|---|---|
| 5,518,539 | 5/1996 | Hao et al. | 106/495 |
| 5,708,188 | 1/1998 | Hao et al. | 548/453 |
| 5,723,626 | 3/1998 | Hao et al. | 548/467 |
| 5,750,758 | 5/1998 | Zambounis et al. | 558/276 |
| 5,755,875 | 5/1998 | Zambounies et al. | 106/498 |

FOREIGN PATENT DOCUMENTS

| | | |
|---|---|---|
| 0320264 | 6/1989 | European Pat. Off. . |
| 0340968 | 11/1989 | European Pat. Off. . |
| 0654711 | 5/1995 | European Pat. Off. . |
| 0742255 | 11/1996 | European Pat. Off. . |
| 0742556 | 11/1996 | European Pat. Off. . |
| 0761772 | 3/1997 | European Pat. Off. . |
| 08179111 | of 1996 | Japan . |

OTHER PUBLICATIONS

Displays, 14/2, 115(1993), Tsuda.
Journal of the SID 1/3, 341–346 (1993), Sugiura.
Kudo et al, Journal of Pholopolymer Science and Technology, 9/1, 109–120 (1996).
Chemical Abstracts, JP–08/44050 (Feb. 1996).
Chemical Abstracts, JP–60/129 738 (Jul. 1985).
Derwent Abstracts, JP–60/184205 (Sep. 1985).
Matsui, IDW '95/CF5, pp. 65–68 (1995).
Kobayaski, Solid State Technology S15–S18 (Nov. 1992).
Tsushima et al., Rad Tech Asia '97, S3–10 pp. 108–110 (Nov. 4, 1997).

*Primary Examiner*—John A. McPherson
*Attorney, Agent, or Firm*—David R. Crichton

[57] ABSTRACT

The invention relates to a color-pigmented high molecular weight organic material structured from a radiation-sensitive precursor by irradiation, the pigmentation of which material consists of extremely fine particles, at least 80 mol % of the pigmentation consisting of a pigment of the class diketopyrrolopyrrole, dioxazine, isoindoline, isoindolinone, disazo condensation yellow or benzimidazolonazo, each containing at least one —NHCO— group, and, where appropriate, a second pigment of the class diketopyrrolopyrrole, dioxazine, isoindoline, isoindolinone, benzimidazolonazo, disazo or phthalocyanine, and, when the structure of the main pigment is point-symmetrical, the two pigments being present in a balanced molar ratio of from 1:1 to 7:3. Those materials are used preferably in the form of thin layers which are built up in patterns in one or more layers on a transparent substrate and can be used, for example, as optical color filters.

14 Claims, No Drawings

HIGHLY TRANSPARENT, COLOR-PIGMENTED HIGH MOLECULAR WEIGHT MATERIAL

The invention relates to a colour-pigmented high molecular weight organic material structured from a radiation-sensitive precursor by irradiation, the pigmentation of which material consists of extremely fine particles, at least 80 mol % of the pigmentation consisting of a pigment of the class diketopyrrolopyrrole, dioxazine, isoindoline, isoindolinone, disazo condensation yellow or benzimidazolonazo, each comprising at least one —NHCO— group, and, where appropriate, a second pigment of the class diketopyrrolopyrrole, dioxazine, isoindoline, isoindolinone, benzimidazolonazo, disazo or phthalocyanine, and, when the structure of the main pigment is point-symmetrical, the two pigments being in a balanced molar ratio of from 1:1 to 7:3. Those materials are used preferably in the form of thin layers which are built up in patterns in one or more layers on a transparent substrate and can be used, for example, as optical colour filters.

Colour filters constitute an extremely exacting technology which makes very high demands on the colorants also. Three pigmentation processes for producing colour filters which are, in principle, fundamentally different are known. A number of variants thereof are described in Displays 14/2, 115 (1993).

For example, it is possible to use dyes that can be completely dissolved in a binder, in a customary solvent or in a solution of the binder in a customary solvent. According to JP-08/44050, a colour strength of ≧2.8 for a film thickness of ≦1.25 μm is possible. Disadvantages of the dyes are their insufficient heat-stability and fastness to light as well as the high costs of that technology.

It is also possible to use dispersions of pigments that are completely insoluble or soluble only in an extremely low concentration in a binder or in a customary solvent. A number of variants of that method are disclosed in Journal of the SID 1/3, 341–346 (1993) and at the IDW'95 (contribution CF-3, pages 57–60 of the printed version). In order to obtain the required fineness of grain corresponding to a very high specific surface, it is necessary to carry out grinding over a long period of time with high friction energy. The particle size should, according to contribution CF-5 at the IDW'95 (pages 65–68 of the printed version), be very fine but not finer than approximately 0.1 μm.

Journal of Photopolymer Science and Technology 9/1, 109–120 (1996) describes photoresists, the pigmentation of which comprises mixtures of Anthraquinone Red 177 with Disazo Yellow 83, Phthalocyanine Green 36 with Disazo Yellow 83 and Phthalocyanine Blue 15:6 with Dioxazine Violet 23 ["Anthraquinone Red 177" is to emphasise the fact that "Colour Index Pigment Red 177" is a pigment of the class anthraquinone, etc ]. EP 340 968 discloses an electrolytic method of producing pigmented thin layers, in which there are used as pigments inter alia various copper phthalocyanines, Dioxazine Violet 23, Quinacridone Violet 19 and Diketopyrrolopyrrole Red 254, and mixtures of β-copper phthalocyanine with Anthraquinone Red 177 (7:3 molar), β-copper phthalocyanine with Quinophthalone Yellow 138 (6:4 molar), and Anthraquinone Red 177 with Quinophthalone Yellow 138 and Thioindigo Violet 177 (?:2:1 molar). Further red pigments that are known for optical applications are also Azo-condensation Red 144 (JP-60/129738) and Quinacridone Red 209 (JP-60/184205), the particle size of the latter pigment being less than 1 μm.

EP 704 497 describes mixed crystals and solid solutions of symmetrical diketopyrrolo-pyrroles that are isomorphous with the crystalline structure of an asymmetrical diketopyrrolopyrrole and can be used in the pigmentation of high molecular weight organic substances. The particle size is not disclosed. EP 654 506 discloses synergistic pigment mixtures that can be used in plastics, surface-coatings or printing inks, where it should also be possible to use inter alia pigments of the class diketopyrrolopyrrole, dioxazine, isoindoline, isoindolinone or phthalocyanine; only two mixtures of diketopyrrolopyrroles (in each case 85:15) and a mixture of a quinacridone with a diketopyrrolopyrrole (90:10) are described as examples thereof.

Disadvantages of the pigment dispersions are that the resolution that is possible does not satisfy the highest requirements and the use of radiation-sensitive formulations results in release of pigment particles which form solid residues both on the colour filters themselves and in the apparatus. Moreover, as disclosed in Solid State Technology S15–S18 (11/1992), pigments cause light-scattering with the result that the sensitivity of the formulations is reduced. It has also been found that grinding and/or redispersing of conventional mixtures of very fine-grain pigments may result in undesirable colour shifts.

A third alternative consists of chemically altering pigments in such a manner that they are completely soluble in a ready-for-use mixture of a binder and a customary solvent. After coating and the customary further processing, the pigment can be regenerated, in which case the pigment precursor must undergo a reaction that clearly requires a high activation energy. That method is described, for example, in EP 654 711 and EP 742 255, wherein inter alia unsubstituted copper phthalocyanine, Diketopyrrolopyrrole Red 255 and Iso-indoline Yellow 139 are used as pigments. EP 742 556 discloses soluble derivatives of Dioxazine Violet 37 for the binder-free pigmentation of a substrate, which can be used as a colour filter. EP 761 772 discloses soluble pigment derivatives having readily removable groups.

An advantage of the third method is that extremely fine particles are formed. The pigments that are known for radiation-sensitive systems have, on the other hand, been found to have the disadvantage that the colour to be expected on the basis of the known pigment properties is not, in practice, obtained with accuracy and often depends upon the process conditions. Moreover, in contrast to mixtures of customary pigments, the commercial forms of which are substantially coarser, the highly concentrated mixtures of extremely fine pigments obtained often exhibit undesirable colour shifts and losses in stability to light, heat and/or the chemicals required in the processing of radiation-sensitive formulations.

Formulation of extremely fine-grain pigments so as to obtain the correct colouring corresponding to exact standards is, consequently, extremely difficult using the methods known hitherto.

The main objective of the invention was to develop a pigmentation that consists of very fine particles and that, in comparison with coarser particles, exhibits as little colour shift as possible and good stability to light, heat and/or the chemicals required in the processing of radiation-sensitive formulations.

A further objective of the invention was to develop pigmentations consisting of as few components as possible, wherein no undesirable interactions occur between the individual components even in high concentrations, with the result that, with every colour, it is possible to obtain high colour saturation and especially colouring in all three primary colours, green, red and blue, that complies with the strict standards.

Surprisingly it has been possible to reach those objectives to an especially high degree with the pigment formulations according to the invention.

The invention relates to a structured pigmented high molecular weight organic material comprising pigment particles of an average particle size of 0.1 µm or less, which is obtainable from a radiation-sensitive precursor by irradiation,
wherein
the organic material comprises at least 5% by weight pigment particles, based on the pigmented material, and at least 80 mol % of the pigment particles consist of a component (a) or of two components (a) and (b), wherein
(a) is selected from the group consisting of diketopyrrolopyrrole, dioxazine, isoindoline, isoindolinone, benzimidazolonazo and bisacetylacetamidarylene-group-containing disazo pigments, each containing at least one —NHCO— group, and
(b) is selected from the group consisting of diketopyrrolopyrrole, dioxazine, isoindoline, isoindolinone, benzimidazolonazo and disazo pigments, each containing at least one —NHCO— group, and phthalocyanine pigments,
wherein
component (b) may be present in no more than an equimolar ratio to component (a), and
when the molecule of component (a) is point-symmetrical, component (b) must be present in a molar ratio to component (a) of from 3:7 to 1:1.

When pigment component (a) is a point-symmetrical pigment, it is important that a second pigment (b) also be present, it being necessary for the second pigment to be in a balanced molar ratio to the symmetrical pigment, with the result that the molar ratio of pigment (b) to the point-symmetrical pigment (a) is from 3:7 to 1:1, preferably from 4:6 to 1:1. In that case, pigment (b) is preferably also point-symmetrical. That restriction does not exist, however, when the main portion consists of a pigment that is not point-symmetrical.

The remaining pigment particles, a maximum of 20 mol %, serve optionally as a toning component (c). Where appropriate, more than one component (c) may be present, provided that the total concentration thereof does not exceed 20 mol %. Component (c) plays a secondary role since it is present in a low concentration and generally serves only for fine adjustment of the colour tone. It is therefore often unimportant which pigments are used as component (c). It is advantageous, however, that each component (c) can be converted reversibly into soluble form. As component (c), preference is given to pigments from the group consisting of diketopyrrolopyrrole, dioxazine, isoindoline, isoindolinone, benzimid-azolonazo, disazo and phthalocyanine pigments.

Mixtures of isomers and homologues, mixtures of variable stoichiometry, polymorphic pigments, mixed crystals and solid solutions are considered as being individual components if they are combined in the same solid and if the latter has been produced in a process in which the different components coexist simultaneously next to one another and the chemical structure or crystal lattice of at least one of those components is altered. As examples of components that, despite comprising a plurality of components, are to be considered as being homogeneous, there may be mentioned partially halogenated pigments or pigments that have been produced by co-recrystallisation.

Pigments resulting from mixing or grinding processes in which only the particle size is altered are, however, considered to be mixtures of a plurality of components, even if, for example, exclusively isomers or homologues are being mixed or ground together.

As component (a), preferred pigments are pyrrolo[3,4-c]pyrroles of formula

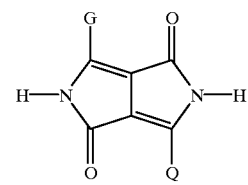

(I)

wherein G and Q are each independently of the other a group of formula

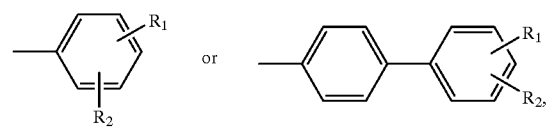

and $R_1$ and $R_2$ are each independently of the other hydrogen, halogen, cyano, carbamoyl, nitro, trifluoromethyl, phenyl, $C_1$–$C_6$alkyl, $C_1$–$C_6$alkoxy, $C_1$–$C_6$alkylthio or $C_1$–$C_6$alkylamino; dioxazines of formula

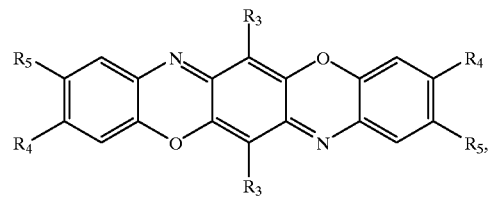

(II)

wherein $R_3$, $R_4$ and $R_5$ are each independently of the others hydrogen, halogen, $C_1$–$C_4$alkyl, $C_1$–$C_4$alkoxy, NHCOC$_1$–C$_4$alkyl or NHCOphenyl, at least 1 of the radicals $R_3$, $R_4$ and $R_5$ being NHCOC$_1$–C$_4$alkyl or NHCOphenyl;

isoindolines of formula

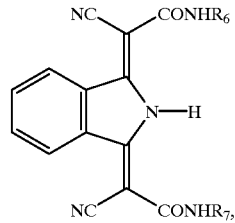
(III)

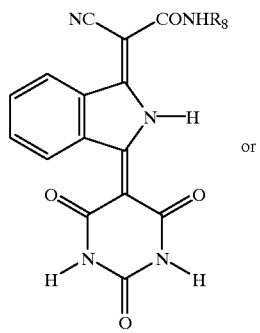
(IV)

or

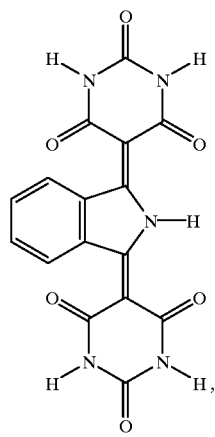
(V)

wherein $R_6$ is a group

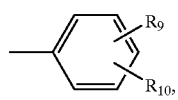

$R_7$ is hydrogen, $C_1$–$C_6$alkyl, benzyl or a group

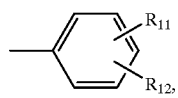

$R_8$ is hydrogen or $R_6$, and
$R_9$, $R_{10}$, $R_{11}$ and $R_{12}$ are each independently of the others hydrogen, $C_1$–$C_6$alkyl, $C_1$–$C_6$alkoxy, halogen or trifluoromethyl; isoindolinones of formula

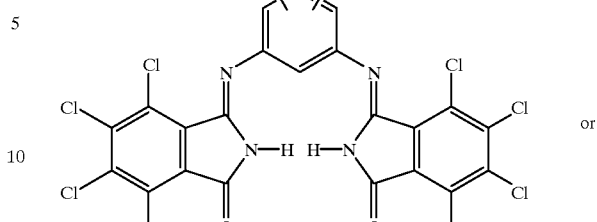
(VI)

or

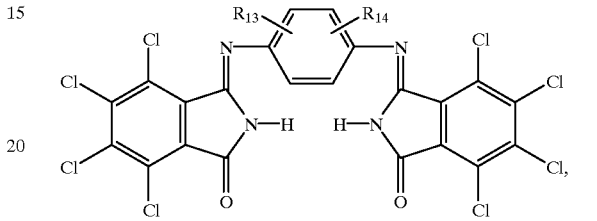
(VII)

wherein $R_{13}$ and $R_{14}$ are each independently of the other hydrogen, halogen or $C_1$–$C_6$alkyl;

benzimidazolonazos of formula

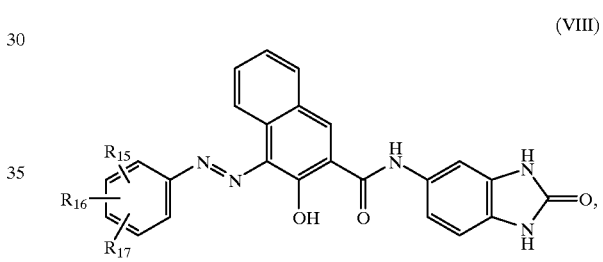
(VIII)

wherein $R_{15}$, $R_{16}$ and $R_{17}$ are each independently of the others hydrogen, halogen, $C_1$–$C_6$alkoxy, $C_1$–$C_6$alkyl, trifluoromethyl, $CONHR_{18}$ or $SO_2NHR_{18}$, and $R_{18}$ is hydrogen, halogen, $C_1$–$C_4$alkyl, or phenyl unsubstituted or substituted by hydrogen, halogen, nitro, $C_1$–$C_4$alkoxy or by $C_1$–$C_4$alkyl; and disazos of formula

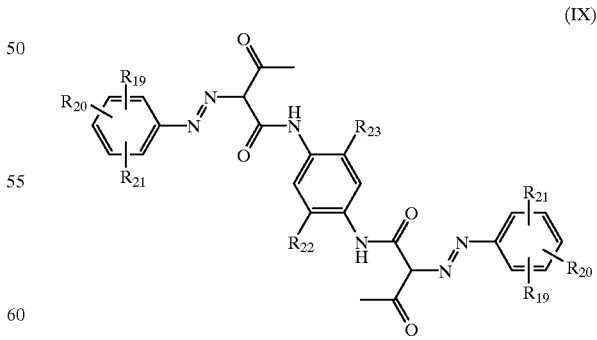
(IX)

wherein
$R_{19}$, $R_{20}$ and $R_{21}$ are each independently of the others hydrogen, halogen, nitro, $C_1$–$C_6$alkoxy, $C_1$–$C_6$alkyl, trifluoromethyl, $CONHR_{24}$ or $SO_2NHR_{24}$, and $R_{22}$ and $R_{23}$ are each hydrogen, halogen, nitro, $C_1$–$C_6$alkoxy or $C_1$–$C_6$alkyl, and $R_{24}$ is hydrogen, halogen, $C_1$–$C_4$alkyl; or phenyl, naphthyl, biphenyl or oxybisphenyl each unsubstituted or substituted by from 1 to 3 substituents selected from the group consisting of halogen, nitro, trifluoromethyl, $C_1$–$C_4$alkoxy and $C_1$–$C_4$alkyl.

As component (b), preference is given to pyrrolo[3,4-c]pyrroles of formula (I), dioxazines of formula (II), isoindolines of formulae (III), (IV) and (V), isoindolinones of formulae (VI) and (VII), benzimidazolonazos of formula (VIII), disazos of formula (IX) and disazos of formula

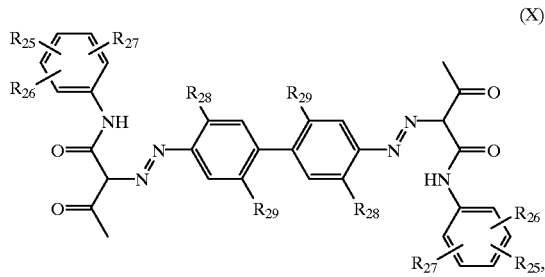

(X)

wherein $R_{25}$, $R_{26}$ and $R_{27}$ are each independently of the others hydrogen, halogen, nitro, $C_1$–$C_6$alkoxy, $C_1$–$C_6$alkyl, trifluoromethyl, $CONHR_{24}$ or $SO_2NHR_{24}$, $R_{28}$ and $R_{29}$ are each independently of the other hydrogen, halogen, $C_1$–$C_6$alkoxy or $C_1$–$C_6$alkyl, and $R_{24}$ is as defined above; and phthalocyanines of formula

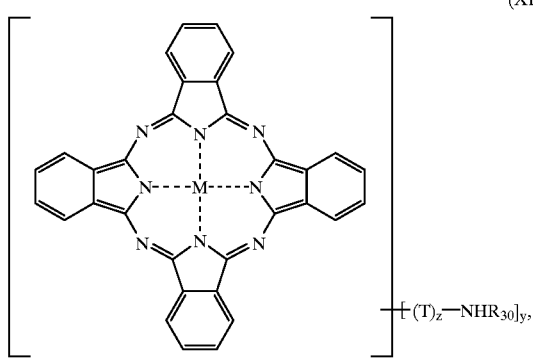

(XI)

wherein

M is $H_2$, a divalent metal selected from the group consisting of Cu(II), Zn(II), Fe(II) Ni(II) and Pd(II), or a divalent oxo-metal selected from the group consisting of V(O), Mn(O) and Ti(O), T is —$CHR_{31}$—, —CO— or —$SO_2$—, $R_{30}$ is hydrogen, $C_1$–$C_6$alkyl, $NH_2$, $NHCOR_{32}$, —$COR_{32}$ or

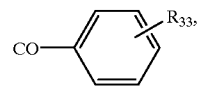

$R_{31}$ is hydrogen or $C_1$–$C_6$alkyl, $R_{32}$ is $C_1$–$C_6$alkyl, $R_{33}$ is hydrogen, halogen, $C_1$–$C_6$alkyl or $C_1$–$C_6$alkoxy, and z is zero or 1 and y is a number from 1 to 8, and, where appropriate, phthalocyanine derivatives obtained from phthalocyanines of formula (XI) as a result of thermal or photochemical decomposition.

Those same pigments are especially preferred as components (c) also. Especially preferably, substantially all the pigment particles consist of preferred pigments.

Especially preferred pigments which, depending upon their class and in accordance with the limitations given above, can be used as components (a), (b) and/or (c), are pyrrolo[3,4-c]pyrroles of formula

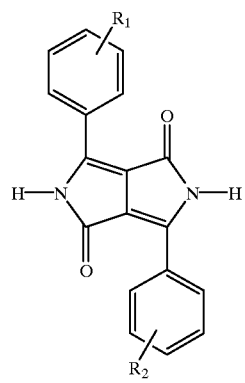

(XII)

wherein $R_1$ and $R_2$ are each independently of the other hydrogen, halogen, cyano, carbamoyl, nitro, trifluoromethyl, phenyl, $C_1$–$C_6$alkyl or $C_1$–$C_6$alkoxy; dioxazines of formula

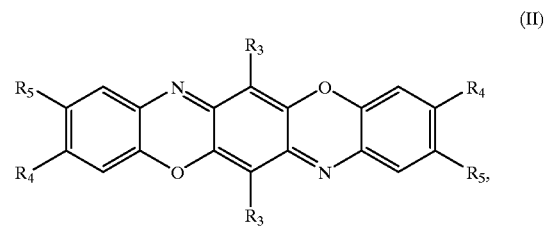

(II)

wherein $R_3$, $R_4$ and $R_5$ are each independently of the others $C_1$–$C_4$alkoxy, $NHCOC_1$–$C_4$alkyl or $NHCOphenyl$, at least 1 of the radicals $R_3$, $R_4$ and $R_5$ being $NHCOC_1$–$C_4$alkyl or $NHCOphenyl$;

the isoindoline of formula

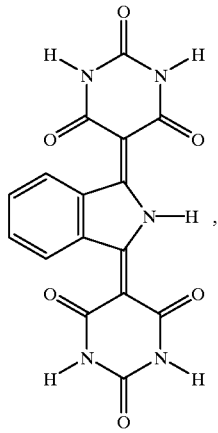
(XIII)

isoindolinones of formula (VI)

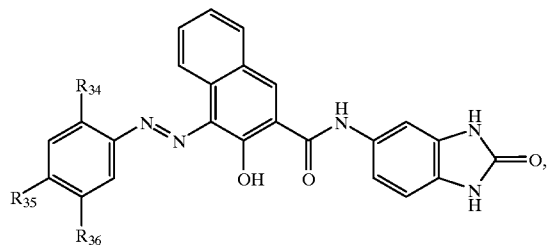

wherein $R_{13}$ and $R_{14}$ are each independently of the other hydrogen, halogen or $C_1$–$C_4$alkyl;

benzimidazolonazos of formula (XIV)

wherein
- $R_{34}$, $R_{35}$ and $R_{36}$ are each independently of the others hydrogen, methoxy, methyl, $CONHR_{37}$ or $SO_2NHR_{37}$, and
- $R_{37}$ is hydrogen or methyl;

disazos of formulae

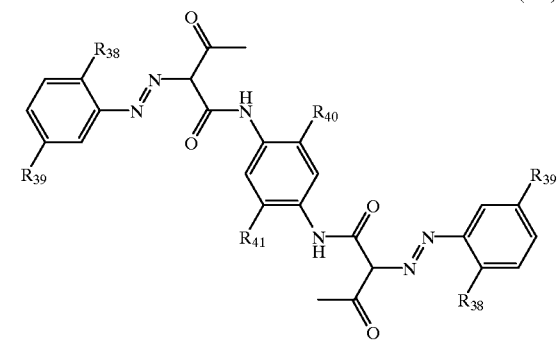
(XV)

and

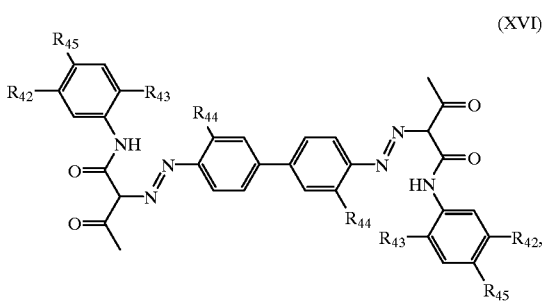
(XVI)

wherein
- $R_{38}$ and $R_{39}$ are each independently of the other hydrogen, chlorine, $CONHR_{46}$ or $SO_2NHR_{46}$; and, especially, $R_{38}$ is chlorine and $R_{39}$ is $CONHR_{46}$,
- $R_{40}$ and $R_{41}$ are each hydrogen, chlorine or methyl,
- $R_{42}$, $R_{45}$ and $R_{43}$ are each independently of the others hydrogen, chlorine, methyl or methoxy,
- $R_{44}$ is chlorine, methyl or methoxy, especially chlorine, and $R_{46}$ is phenyl or oxybisphenyl each unsubstituted or substituted by from 1 to 3, especially 2, substituents selected from the group consisting of chlorine, trifluoromethyl, methoxy and methyl; $R_{46}$ is especially phenyl or oxybisphenyl each substituted by 2 substituents selected from the group consisting of chlorine, trifluoromethyl and methyl;

phthalocyanines of formula

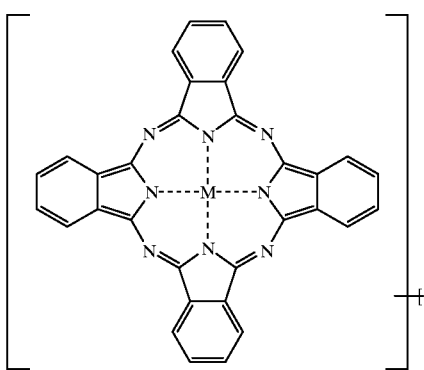

(XVII)

wherein M is $H_2$, a divalent metal selected from the groups consisting of Cu(II), Zn(II), Fe(II) and Ni(II), T is —CO— or —$SO_2$— and y is a number from 1 to 4; and where appropriate, phthalocyanine derivatives obtained from phthalocyanines of formula (XVII) as a result of thermal or photochemical decomposition.

As component (a) or (b) or as additional component (c), special preference is given to disazos of formula (XV). In combination with blue pigments, excellent green shades are obtained especially when the disazos of formula (XV) are used as component (a) or (b).

Very special preference is given to pigments of formulae

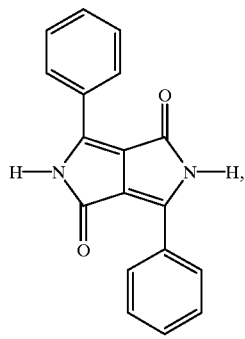

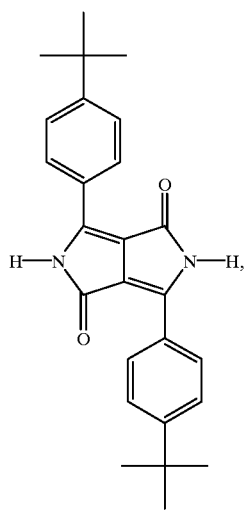

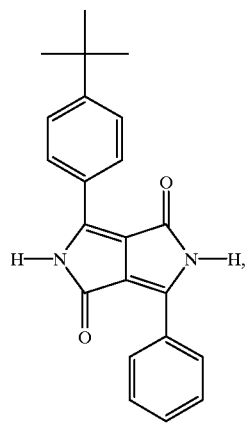

13 14
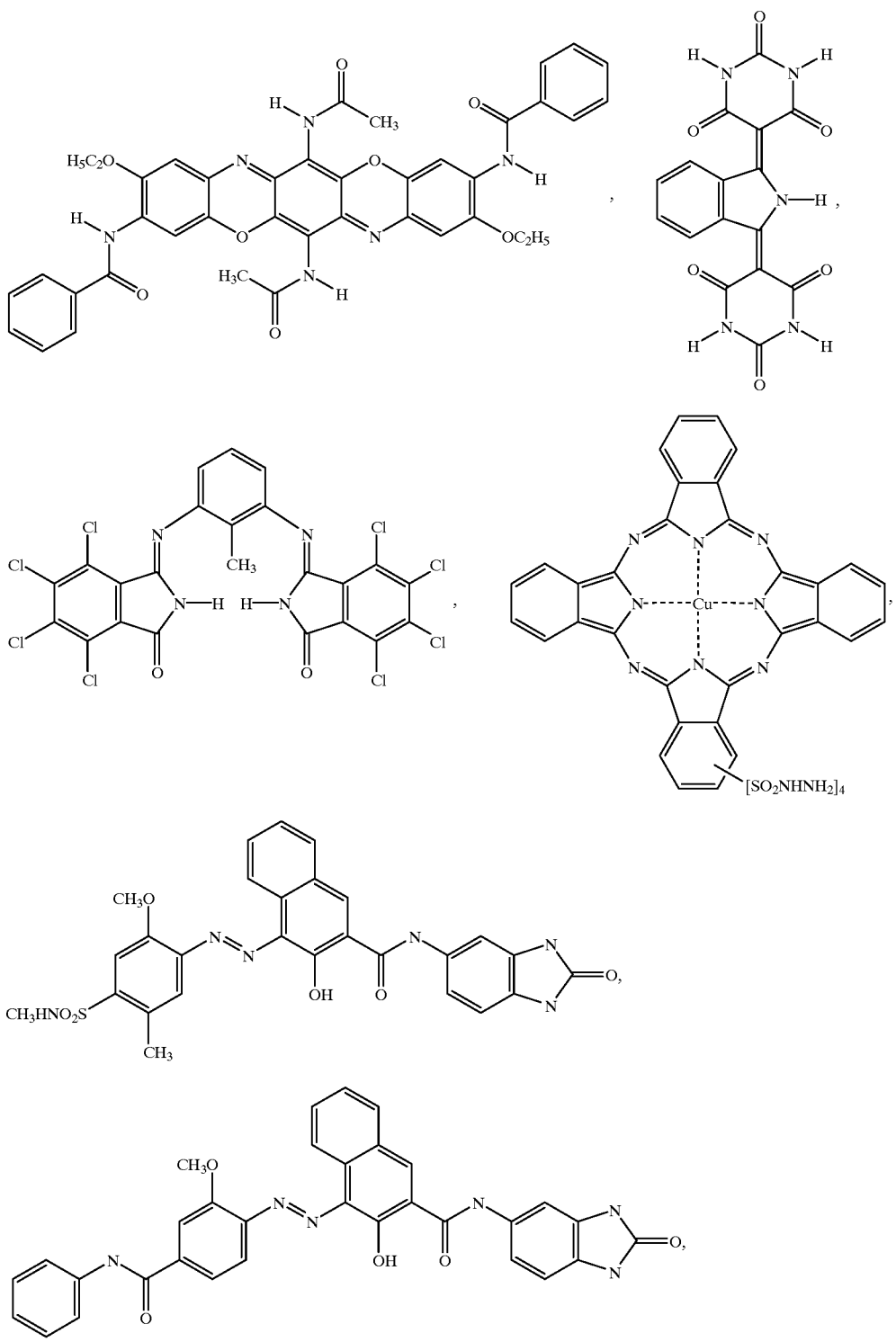

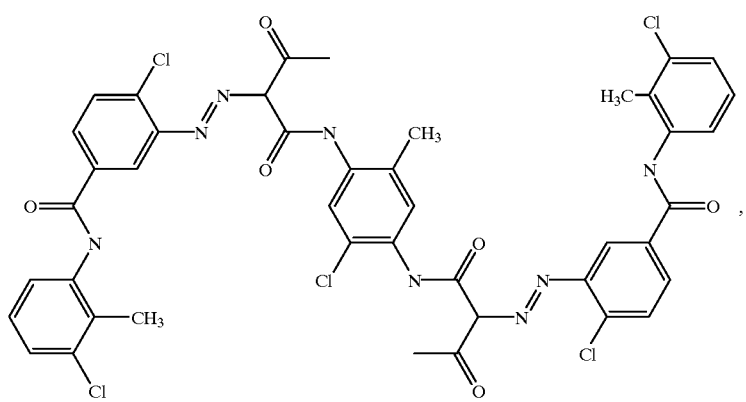
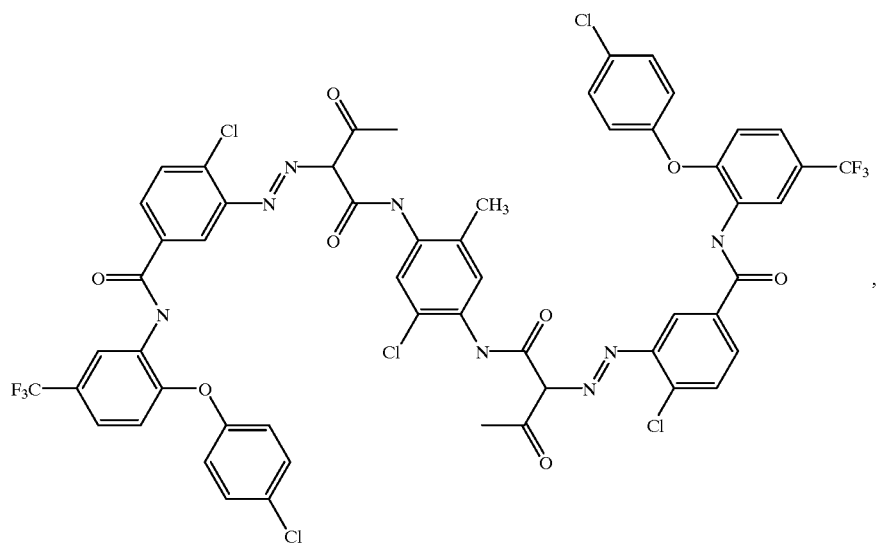
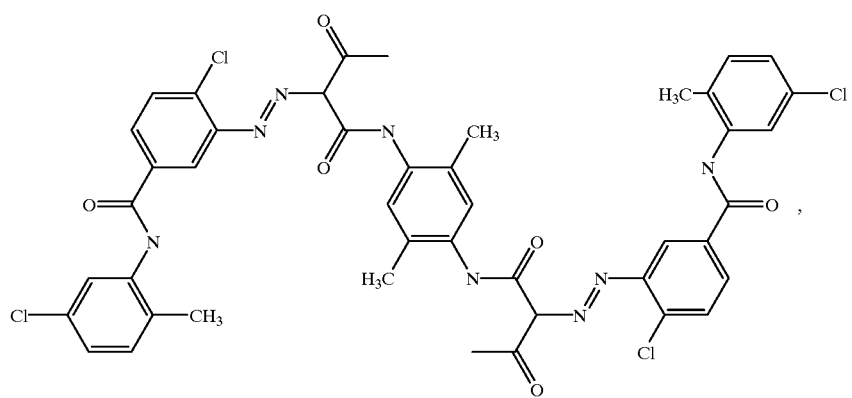
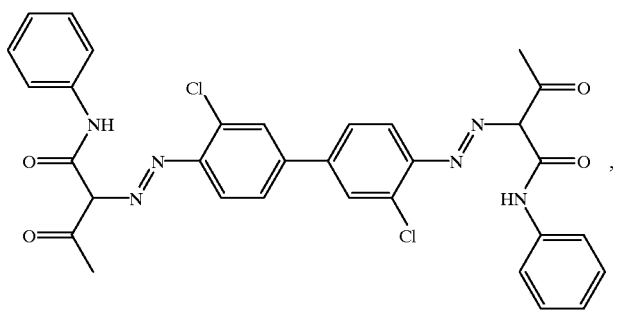

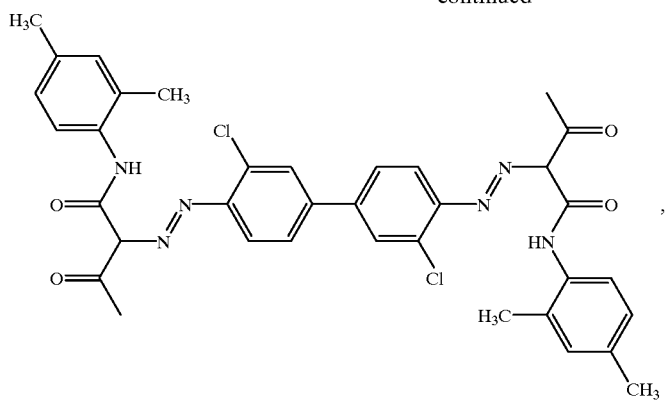

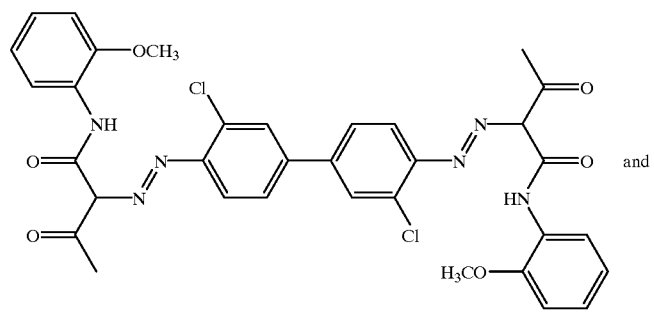

and

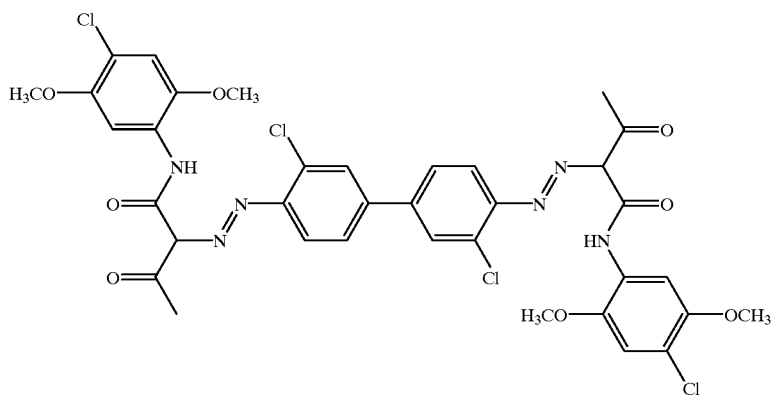

Surprisingly it has been found that in the case of the pigments used as component (a) it is significant whether they are symmetrical and, if they are, which form of symmetry they exhibit. It is most advantageous for components (a) to be asymmetrical, in which case the addition of a component (b) is possible but has scarcely any additional advantages. If component (a) is mirror-symmetrical, the addition of a component (b) is not imperative but is, however, generally advantageous. In the case of a point-symmetrical component (a), however, it is necessary according to the invention to use an added component (b) in a relatively high molar ratio to component (a) of from 3:7 to 1:1.

Point-symmetrical pigments are, for example,

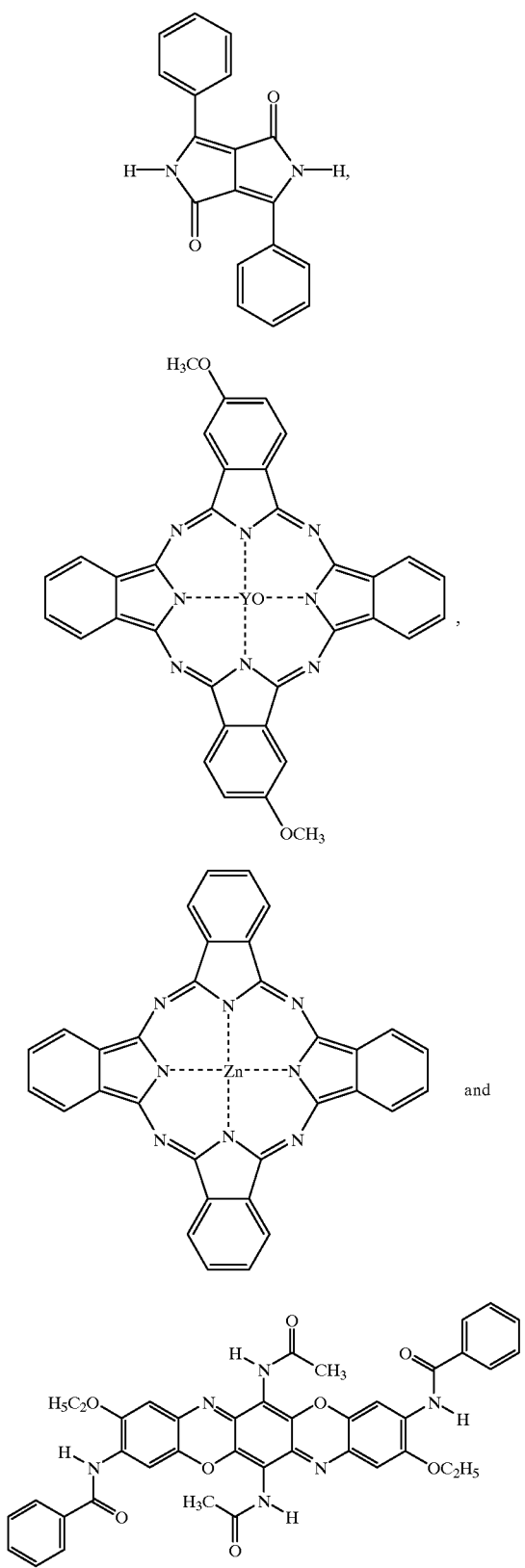

By contrast, for example,

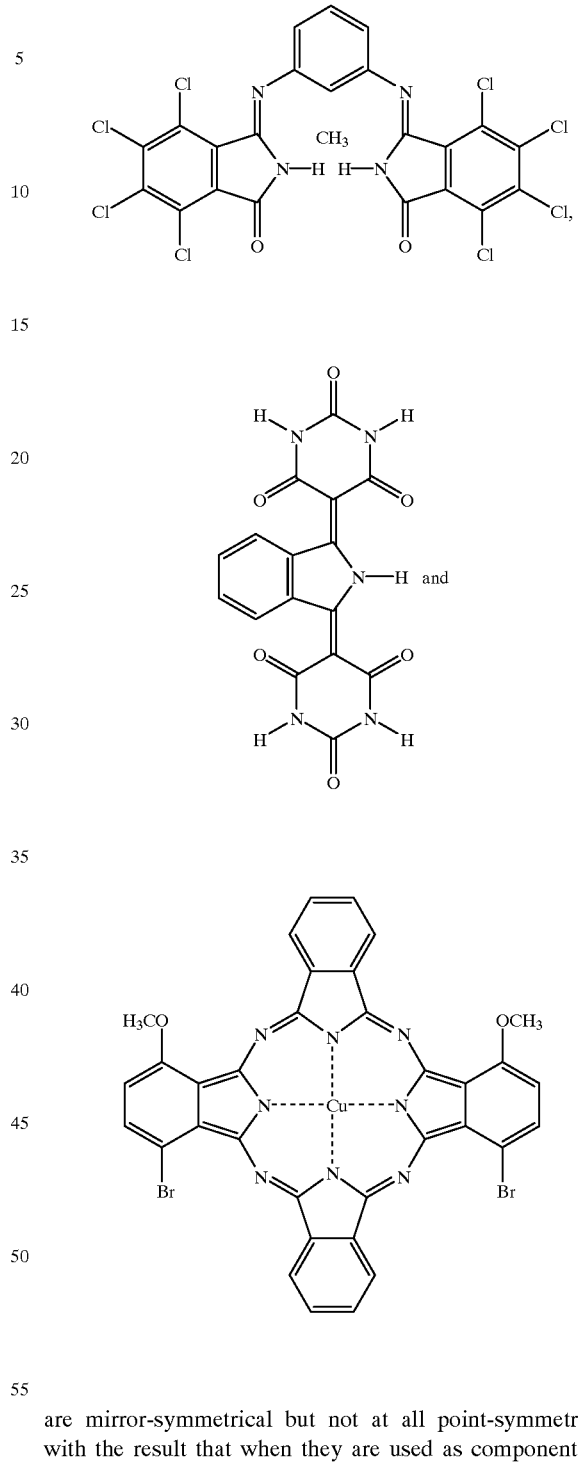

are mirror-symmetrical but not at all point-symmetrical, with the result that when they are used as component (a), component (b) may be present in any amount up to a 1:1 molar ratio to component (a) or may even be completely absent.

The same applies, of course, also to pigments that are neither point-symmetrical nor mirror-symmetrical, such as, for example,

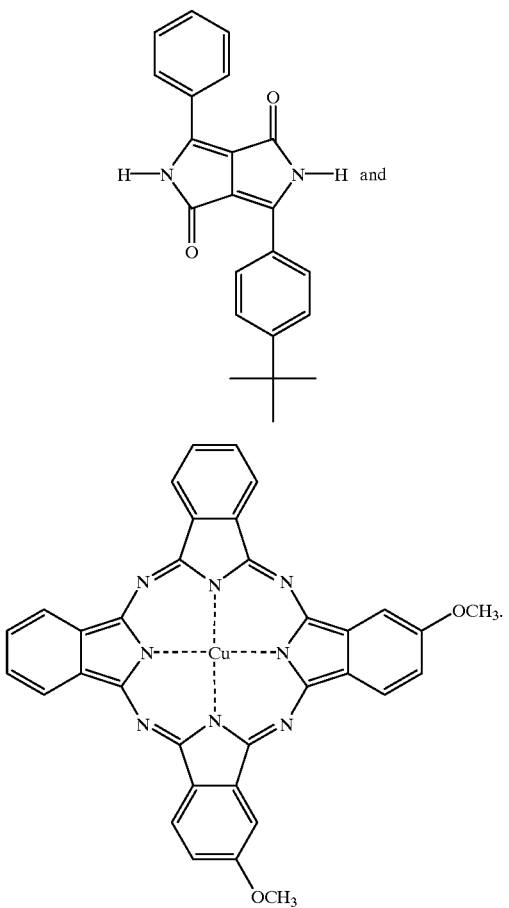

For the purpose of determining the symmetry it should be assumed that the pigment molecule is planar, that bond and hydrogen tautomerism is as symmetrical as possible and that single bonds have been rotated to and frozen in a position in which the molecule is as symmetrical as possible. Experimental findings, for example from X-ray crystal analyses or nuclear resonance spectroscopy, should be disregarded.

Alkyl may be straight-chain, branched or cyclic. $C_1$–$C_6$Alkyl is thus, for example, methyl, ethyl, n-propyl, isopropyl, n-butyl, sec-butyl, isobutyl, tert-butyl, cyclobutyl, n-pentyl, 2-pentyl, 3-pentyl, 2,2-dimethylpropyl, cyclopentyl, cyclohexyl or n-hexyl, especially straight-chain or branched $C_1$–$C_4$alkyl.

$C_1$–$C_6$Alkoxy is O—$C_1$–$C_6$alkyl, especially O—$C_1$–$C_4$alkyl.

Halogen is chlorine, bromine, fluorine or iodine, especially chlorine or bromine.

The pigmented, radiation-structured high molecular weight organic material according to the invention preferably comprises at least 10% by weight pigment particles, based on the pigmented high molecular weight material. Especially preferably it comprises from 20 to 70% by weight pigment particles, based on the pigmented high molecular weight material.

High molecular weight organic materials are to be understood as those having a molecular weight of from approximately $10^3$ to $10^7$ g/mol.

The average particle size of the pigment particles is preferably from 0.01 to 0.05 μm.

Average particle size is taken to be the maximum of the particle size distribution curve according to weight.

Preferably at least 90 mol % of the pigment particles consist of a component (a) or of two components (a) and (b).

When the molecule of component (a) is point-symmetrical, component (b) is preferably present in a molar ratio to component (a) of from 4:6 to 1:1.

The pigments according to the invention of the classes diketopyrrolopyrrole, dioxazine, isoindoline or isoindolinone preferably contain at least 2 —NHCO— groups, especially preferably at least 4 —NHCO— groups.

The pigmented high molecular weight organic material according to the invention is preferably coated onto a transparent substrate in the form of a thin layer having a thickness of ≦20 μm, especially ≦10 μm, very especially ≦5 μm. When there is more than one layer, each individual layer preferably has a thickness of ≦2 μm, especially ≦1 μm. The transparency of the substrate at from 400 to 700 nm is consistently ≧95%, especially consistently ≧98%. Preferably the substrate and all the layers are smooth, the surface roughness thereof being especially preferably ≦0.1 μm. For example, glass or polycarbonate films may be used as smooth substrates.

Further preferred properties of colour filters are known to the person skilled in the art and may be found, for example, in the relevent literature or in the publications already mentioned. In general, preferenc e is given to the materials according to the invention in which the pigment particles are regenerated (in situ) from their soluble derivatives during or after structuring. An especially high degree of resolution and transparency is possible in that case.

The pigmented high molecular weight organic material according to the invention is preferably red, blue or green, especially red or blue, more especially red. For example, on the x,y-chromaticity diagram (CIE 1931), red may have the coordinates x=0.630±0.020/y=0.335±0.005; blue may have the coordinates x=0.148±0.004/y=0.068±0.014; and green may have the approximate coordinates x=0.305±0.015/y=0.63±0.04. Since the standards for colour filters vary slightly from one manufacturer to another and may also change with progress in the technology, those values serve only as a guide. Owing to their excellent colour saturation and high transparency, with the pigmented materials according to the invention other colours may also be obtained in a surprisingly broad colour scale.

Special preference is given to a transparent substrate, onto which there are coated in any sequence a red, a blue and a green thin layer of a pigmented material according to the invention, the different coloured layers being in such a pattern that each of the red, blue and green layers does not overlap with a layer of a different colour on at least 5% of its area. Preferably, each red, blue and green layer's area not overlapping with a layer of a different colour is at least 10%, most preferably at least 20% of its total area.

Structuring is effected by irradiation of a radiation-sensitive precursor, where appropriate with the aid of heat and/or chemicals during or after the irradiation. Structuring is to be understood as being a change in the physical properties, so that, for example, material that is insoluble in a particular liquid becomes soluble therein, or vice versa. The processes suitable for structuring vary greatly depending upon the material that is to be structured but are, however, known to the person skilled in the art for each known material that can be structured.

The terms "resists" and "photoresists" are often used for radiation-sensitive precursors that yield structured organic materials by irradiation. Very many such precursors are known to the person skilled in the art. They are of positive or negative type depending upon whether the precursor is rendered soluble or insoluble by the irradiation and, where applicable, by the subsequent treatment. For example, the solubility of polymers or polymer precursors is altered by crosslinking, polymerisation or depolymerisation. The technology of resists is described in many publications and technical reference books, for example also in the context of latent pigments in EP 654 711.

Preferably the precursors that can be structured to form the organic materials according to the invention are the systems b1) to b5), and especially b10), disclosed in EP 654 711 A1, the main components of which are described on page 17/line 16 to page 26/line 1, and on page 26/line 39 to page 29/line 11. Within each category of resists, preference is given to those compounds which are given as preferred in EP 654 711.

The pigmented material according to the invention receives its final high molecular weight structure as a result of the irradiation and, where applicable, a subsequent treatment, it being unimportant whether the irradiation was directed at the areas that remain or at the areas that have disappeared.

For the irradiation there may be used, for example, any broadband or monochromatic electromagnetic radiation, for example of a wavelength in the range from 250 to 1000 nm or from 0.01 to 10 nm. Depending upon the precursor, electron beams or ion beams may also be used. The irradiation is preferably effected through a mask so that irradiation occurs only in places, which consequently results in patterns.

The subsequent treatment carried out where applicable is one of the known customary after-treatments, such as, for example, thermal curing or a treatment using a developing bath.

The pigments may be incorporated in the radiation-sensitive precursor compositions in the form of very fine dispersions, for example in accordance with the process given in JP-08/179111. The pigments are, however, preferably incorporated into the radiation-sensitive precursor compositions in the form of soluble derivatives, in which case the pigment derivatives should advantageously be completely soluble in the composition ready for coating which contains the radiation-sensitive precursor and optionally a solvent and any further additives.

The soluble pigment derivatives can be prepared in accordance with or analogously to methods known per se as described, for example, in EP 648 770, EP 648 817, EP 654 711 and EP 742 255. For example, a pigment of the class diketopyrrolopyrrole, dioxazine, isoindoline, isoindolinone, disazo or phthalocyanine, each containing from 1 to 6 —NHCO— groups, can be reacted in the desired molar ratio with a pyrocarbonic acid diester of formula

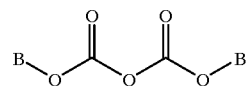

in an aprotic organic solvent in the presence of a base as catalyst, advantageously at temperatures of from 0 to 120° C., preferably from 10 to 100° C., for from 2 to 80 hours.

The molar ratio in each case depends upon the number of radicals B to be introduced. Advantageously the dicarbonate is used in excess.

Suitable aprotic organic solvents are, for example, ethers, such as tetrahydrofuran or dioxane, or glycol ethers, such as ethylene glycol methyl ether, propylene glycol ethyl ether, diethylene glycol monoethyl ether or dipropylene glycol dimethyl ether, and dipolar aprotic solvents, such as acetonitrile, benzonitrile, N,N-dimethyfformamide, N,N-dimethylacetamide, nitrobenzene, N-methylpyrrolidone, halogenated aliphatic or aromatic hydrocarbons, such as trichloroethane, benzene or alkyl-, alkoxy- or halo- substituted benzene, such as toluene, xylene, anisole or chlorobenzene, or aromatic N-heterocycles, such as pyridine, picoline or quinoline. Preferred solvents are, for example, tetrahydrofuran, N,N-dimethylformamide, methylpyrrolidone. The mentioned solvents can al so be used in the form of mixtures. Advantageously, 5–20 parts by weight of solvent are used to 1 part by weight of reactants.

Bases suitable as catalyst are, for example, the alkali metals themselves, such as lithium, sodium or potassium and the hydroxides and carbonates thereof, or alkali metal amides, such as lithium, sodium or potassium amide, or alkali metal hydrides, such as lithium, sodium or potassium hydride, or alkaline earth metal or alkali metal alcoholates derived especially from primary, secondary or tertiary aliphatic alcohols having from 1 to 10 carbon atoms, such as, for example, lithium, sodium or potassium methanolate, ethanolate, n-propanolate, isopropanolate, n-butanolate, sec-butanol ate, tert-butanolate, 2-methyl-2-butanolate, 2-methyl-2-pentanolate, 3-methyl-3-pentanolate, 3-ethyl-3-pentanolate, and organic aliphatic, aromatic or heterocyclic N-bases, including, for example, diazabicyclooctene, diazabicycloundecene and 4-dimethylaminopyridine and trialkylamines, for example trimethyl- or triethyl-amine. It is also possible, however, to use a mixture of the mentioned bases.

Preference is given to the organic N-bases, for example diazabicyclooctane, diazabicyclo-undecene and especially 4-dimethylaminopyridine.

It is especially preferred to carry out the reaction at temperatures of from 18 to 40° C. and at a pressure of from 0.8 to 1.2 bar, especially of approximately 1 bar.

The suitable pyrocarbonic acid diesters of formula

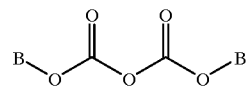

can be prepared analogously to generally known methods. Most of the chemicals required for that purpose are known. Many are commercially available and all of them can be prepared in accordance with methods known per se.

In the case of reaction of a pigment that contains from 1 to 6 —NHCO— groups with a pyrocarbonic acid diester of formula

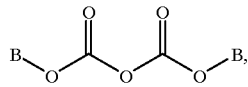

depending upon the stoichiometry soluble pigment derivatives that contain from 1 to 6

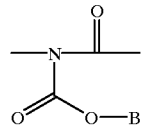

groups are produced. It is not, however, necessary for all of the hydrogen atoms of the —NHCO— groups to be replaced by $CO_2B$. On the contrary, if more than one —NHCO— group is present in the pigment it is often advantageous for some of the —NHCO— groups to remain unchanged. If, in addition to the from 1 to 6 —NHCO— groups, the pigment has one or more phenolic —OH groups, then it is also possible and, for the purposes of the invention, absolutely acceptable for a number or all of those groups to react with the pyrocarbonic acid diester of formula

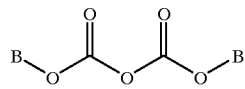

to form —O—$CO_2$—B groups.

B may be any group that is known for solubilising pigments. Preferably, however, —B is a group of formula

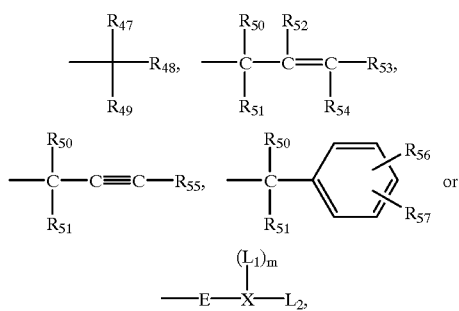

wherein $R_{47}$, $R_{48}$ and $R_{49}$ are each independently of the others $C_1$–$C_6$alkyl, $R_{50}$ and $R_{51}$ are each independently of the other $C_1$–$C_6$alkyl; $C_1$–$C_6$alkyl interrupted by O, S or by $N(R_{58})_2$; or phenyl or biphenyl each unsubstituted or substituted by $C_1$–$C_6$alkyl, $C_1$–$C_6$-alkoxy, halogen, cyano or by nitro, $R_{52}$, $R_{54}$ and $R_{53}$ are each independently of the others hydrogen or $C_1$–$C_6$alkyl, $R_{55}$ is hydrogen, $C_1$–$C_6$alkyl or a group of formula

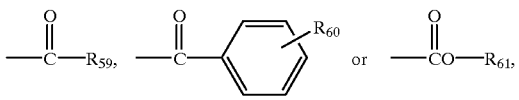

$R_{56}$ and $R_{57}$ are each independently of the other hydrogen, $C_1$–$C_6$alkyl, $C_1$–$C_6$alkoxy, halogen, cyano, nitro, $N(R_{58})_2$; or phenyl unsubstituted or substituted by halogen, cyano, nitro, $C_1$–$C_6$alkyl or by $C_1$–$C_6$alkoxy, $R_{58}$ and $R_{59}$ are each $C_1$–$C_6$alkyl, $R_{60}$ is hydrogen or $C_1$–$C_6$alkyl and $R_{61}$ is hydrogen, $C_1$–$C_6$-alkyl, or unsubstituted or $C_1$–$C_6$alkyl-substituted phenyl, E is p,q-$C_2$–$C_6$alkylene unsubstituted or mono- or polysubstituted by $C_1$–$C_6$alkoxy, $C_1$–$C_6$alkythio or by $C_2$–$C_{12}$dialkylamino, wherein p and q are different position numbers, X is a hetero atom selected from the group consisting of N, O and S; and when X is O or S m is zero and when X is N m is 1, and $L_1$ and $L_2$ are each independently of the other $C_1$–$C_6$alkyl or [-(p',q'-$C_2$–$C_6$alkylene)—Z—]$_n$—$C_1$–$C_6$alkyl each unsubstituted or mono- or poly-substituted by $C_1$–$C_6$alkoxy, $C_1$–$C_6$alkylthio, $C_2$–$C_{12}$dialkylamino, $C_6$–$C_{12}$aryloxy, $C_6$–$C_{12}$arylthio, $C_7$–$C_{18}$arylalkylamino or by $C_{12}$–$C_{24}$diarylamino, wherein n is a number from 1 to 1000, p' and q' are different position numbers, each Z is independently of the others a hetero atom O, S or $C_1$–$C_{12}$alkyl-substituted N, and $C_2$–$C_6$alkylene in the repeating units [—$C_2$–$C_6$alkylene-Z—] may be the same or different, and $L_1$ and $L_2$ may be saturated or from mono- to deca-unsaturated, uninterrupted or interrupted at any position(s) by from 1 to 10 groups selected from the group consisting of —(C=O)— and —$C_6H_4$—, and may have no substituents or from 1 to 10 further substituents selected from the group consisting of halogen, cyano and nitro.

$C_2$–$C_6$Alkylene is, for example, 1,2-ethylene, 1,2-propylene, 1,3-propylene, 1,2-butylene, 1,3-butylene, 2,3-b utylene, 1,4-butylene, 2-methyl-1,2-propylene or an isomer of pentylene or hexylene.

$C_6$–$C_{12}$Aryloxy is O—$C_6$–$C_{12}$aryl, for example phenoxy or naphthoxy, preferably phenoxy.

$C_1$–$C_6$Alkylthio is S—$C_1$–$C_6$alkyl, preferably S—$C_1$–$C_4$alkyl.

$C_6$–$C_{12}$Arylthio is S—$C_6$–$C_{12}$aryl, for example phenylthio or naphthylthio, preferably phenylthio.

$C_2$–$C_{12}$Dialkylamino is N(alkyl$_1$)(alkyl$_2$), the sum of the carbon atoms in the two groups alkyl$_1$ and alkyl$_2$ being from 2 to 12, and is especially N($C_1$–$C_4$alkyl)-$C_1$–$C_4$alkyl.

$C_7$–$C_{18}$Alkylarylamino is N(alkyl$_1$)(aryl$_2$), the sum of the carbon atoms in the two groups alkyl$_1$ and aryl$_2$ being from 7 to 18, and is especially methylphenylamino or ethylphenylamino.

$C_{12}$–$C_{24}$Diarylamino is N(aryl$_1$)(aryl$_2$), the sum of the carbon atoms in the two groups aryl$_1$ and aryl$_2$ being from 12 to 24, and is, for example, diphenylamino or phenylnaphthylamino, especially diphenylamino.

The soluble pigment derivatives are converted back into the pigment s again during or preferably after the structuring of the radiation-sensitive precursor to form the high molecular weight material.

That can be achieved in a very simple manner by thermal treatment (heating to temperatures of from 50 to 250° C., preferably from 100 to 200° C., depending on the pigment) of the structured high molecular weight materials containing the soluble pigment derivatives. Where appropriate, the presence of a catalyst, for example an acid, may prove expedient during the thermal conversion of the soluble pigment derivatives back into the pigments.

The colour-pigmented high molecular weight organic materials according to the invention exhibit high colour strength, brilliance and transparency. They are excellently suitable for the production of colour filters for visible light in the range from 400 to 700 nm.

The invention relates accordingly also to a method of altering the spectrum of a visible light beam by the selective absorption of a portion of the radiation by means of a coloured medium, which method comprises using as coloured medium a pigmented high molecular weight organic material according to the invention that has been coated onto a transparent substrate.

The colour filters according to the invention can be used with excellent results in liquid crystal displays, plasma displays or electroluminescent displays. These may be, for example, active (twisted nematic) or passive (supertwisted nematic) ferroelectric displays or light-emitting diodes.

The following Examples illustrate the invention:

EXAMPLE 1

140 g of copper phthalocyanine are introduced, under nitrogen, into 582 ml of chlorosulfonic acid in a 1.5 liter multi-necked flask equipped with an anchor stirrer, thermometer, reflux condenser, inert gas supply and gas washer, and are stirred at 140° C. for 3 hours. The dark green solution is then cooled to 85° C., 176 ml of thionyl chloride are added dropwise over a period of 15 minutes and the mixture is stirred further at that temperature for 3 hours and is then left to cool overnight. The dark green solution is added dropwise, with stirring, to a mixture of 4 kg of water and 4 kg of ice, the temperature rising to 20° C. The blue suspension is then filtered and the residue is washed 3 times using 4 liters of water each time and dried with suction. The still moist crude sulfochlorinated copper phthalocyanine is used further immediately.

In a 6 liter multi-necked flask equipped with an anchor stirrer, thermometer, reflux condenser and nitrogen supply, a solution of 385 g of tert-butyl carbazate in 1 liter of tetrahydrofuran (THF) is poured, under nitrogen, into the crude sulfochlorinated copper phthalocyanine dissolved in 3 liters of THF, and the blue solution is stirred further at room temperature for 1 hour. The reaction solution is then concentrated as completely as possible by evaporation using a rotary evaporator and the blue pasty residue is dissolved in 2 liters of $CH_2Cl_2$; 1 liter of diethyl ether ($Et_2O$) is added and the mixture is slowly added dropwise, with vigorous stirring, to 14 liters of hexane. The fine precipitate is removed by filtration and dried well with suction. 317.9 g of a blue solid are obtained, which, according to thin-layer chromatography (silica gel/ethyl acetate=EtOAc), contains the desired product ($R_f$=1.0) and a highly polar secondary product ($R_f$=0). The crude product is dissolved in 2 liters of EtOAc and filtered in order to separate it from the insoluble whitish blue solid. The filtrate is concentrated by evaporation to 1.2 liters and filtered with 6 liters of EtOAc over 2.5 kg of silica gel on a suction-filter (layer thickness 5 cm). The fractions that contain the nonpolar product are combined and concentrated by evaporation. The residue is dissolved in 500 ml of $CH_2Cl_2$; 150 ml of $Et_2O$ are added and the mixture is slowly added dropwise, with vigorous stirring, to 6.5 liters of hexane. The precipitate is removed by filtration, washed 3 times with 500 ml of hexane each time and dried at 60° C./160 mbar for 28 hours. 153.7 g of blue powdery N-hydrazinecarboxylic acid tert-butyl ester-substituted copper phthalocyanine are obtained.

Thermogravimetric analysis shows a weight loss of 51.9% with a mid-point of 172° C.

UV/Vis (NMP=N-methylpyrrolidone): $\lambda_{max}$=673 nm, $\epsilon$=153 820 l.mol$^{-1}$.cm$^{-1}$;

Analysis [%]: calc. C, 46.17; H, 4.17; N, 16.57; S, 9.48; Cl, 0.00; ($C_{52}H_{56}CuN_{16}O_{16}S_4$) found C, 46.05; H, 4.42; N, 16.02; S, 8.54; Cl, 0.53.

EXAMPLE 2

A solution of 3.9 g of dimethylaminopyridine and 49.25 g of di-tert-amyl dicarbonate in 100 ml of THF is added to a suspension of 72.7 g of C.I. Pigment Violet 37 in 1500 ml of THF. The mixture is stirred overnight at 23° C., a further solution of 49.25 g of di-tert-amyl dicarbonate in 100 ml of THF is then added, and the mixture is stirred overnight. The reaction mixture is filtered through kieselguhr (®Celite Filter Cel, Fluka) and the filtrate is concentrated to dryness by evaporation. The residue is suspended in 300 ml of n-hexane, filtered and concentrated to dryness by evaporation. 86 g of the red compound of formula:

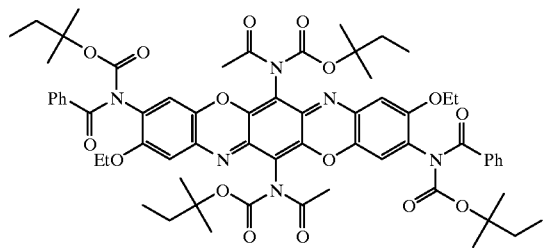

are obtained.

Analysis [%]: calc. C, 64.96; H, 6.30; N, 7.10; ($C_{64}H_{74}N_6O_{16}$) found C, 65.11; H, 6.36; N, 6.99;

$^1$H-NMR (CDCl$_3$, 300 MHz) δ: 7.69 (d,4H); 7.45 (t,2H); 7.35 (t,4H); 6.97 (s,1H); 6.96 (s,1H); 6.95 (s,1H); 6.94 (s,1H); 4.00 (q,4H); 2.60 (m,6H); 1.10–1.70 (m,30H); 0.60 (m,12H).

EXAMPLE 3

13.5 g of ethyl chloroacetate and 18.2 g of powdered potassium carbonate are boiled at reflux in 60 ml of acetone for 16 hours. The mixture is left to cool to room temperature, is filtered and washed with hexane. The filtrate is concentrated using a rotary evaporator, there being obtained in a practically quantitative yield the compound of formula

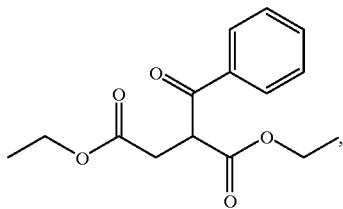

which is used further in the form of a crude product.

That crude product and 78.5 g of ammonium acetate are boiled at reflux in 90 ml of glacial acetic acid for 2 hours. The mixture is poured into ice/water and the crude product that precipitates out is removed by filtration. Recrystallisation from ethanol/water yields 15.3 g (60% of the theoretical yield) of the crystalline pyrrolinone of formula

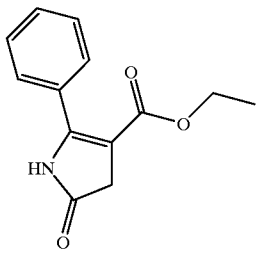

having a melting point of 173–176° C.

Analysis [%]: calc. C, 67.52; H, 5.67; N, 6.06; ($C_{13}H_{13}NO_3$) found C, 67.52; H, 5.71; N, 5.90.

4.35 g of sodium and 0.05 g of sulfosuccinic acid bis-2-ethylhexyl ester sodium salt are stirred at reflux temperature in 100 ml of tert-amyl alcohol until the reaction is complete. 12 g of 4-tert-butylbenzonitrile are added at 95° C. to the clear solution and then 14.6 g of the pyrrolinone obtained above are added in portions over a period of 30 minutes. The reaction mixture is stirred at 100° C. for 3 hours. The reaction mixture is then cooled to room temperature and introduced into a mixture of 15.8 ml of 37% HCl and 600 ml of methanol and subsequently stirred at room temperature for 2 hours. The red mixture is removed by filtration, washed with methanol and then with water and dried in vacuo at 60° C. 17.6 g (81% of the theoretical yield) of the pigment of formula

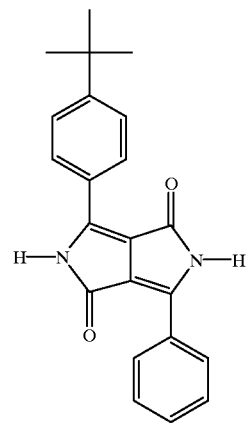

are obtained.

Analysis [%]: calc. C, 76.72; H, 5.85; N, 8.13; ($C_{22}H_{20}N_2O_2$) found C, 76.47; H, 5.72; N, 8.10.

EXAMPLE 4

37 g of di-tert-amyl dicarbonate and then 2.93 g of 4-dimethylaminopyridine are added to a suspension of 20.7 g of the product according to Example 3 in 600 ml of THF. The reaction mixture is stirred at room temperature for 4 hours. The solvent is then distilled off under reduced pressure. The residue is washed with methanol and dried in vacuo at room temperature. 31.3 g (91% of the theoretical yield) of a bright yellow product of formula:

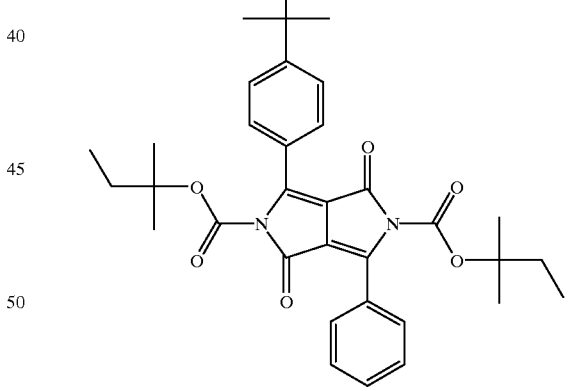

are obtained.

Analysis [%]: calc. C, 71.31; H, 7.04; N, 4.89; ($C_{34}H_{40}N_2O_6$) found C, 71.28; H, 6.95; N, 4.74.

EXAMPLE 5

A mixture of 28.8 g of C.I. Pigment Red 255, 4.9 g of dimethylaminopyridine and 73.9 g of di-tert-amyl dicarbonate in 1000 ml of THF is stirred at 23° C. for 18 hours, a further 24.6 g of di-tert-amyl dicarbonate being added after 5 hours. The reaction mixture is concentrated to dryness by evaporation in vacuo. The moist residue is taken up in 150 ml of methanol, stirred for 1 hour, filtered and concentrated to dryness by evaporation in vacuo at room temperature. 46.2 g of a crystalline yellow compound of formula:

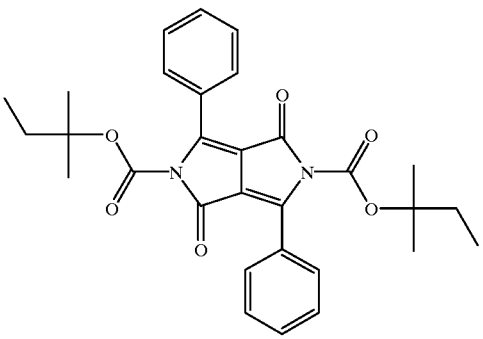

are obtained.

Analysis [%]: calc. C, 69.75; H, 6.24; N, 5.42; ($C_{30}H_{32}N_2O_6$) found C, 69.68; H, 6.43; N, 5.34.

EXAMPLE 6

A mixture of 28.0 g of C.I. Pigment Orange 73, 3.42 g of dimethylaminopyridine and 51.7 g of di-tert-amyl dicarbonate in 700 ml of THF is stirred at 23° C. for 22 hours. The reaction mixture is concentrated to dryness by evaporation in vacuo. The moist residue is stirred in 100 ml of methanol, filtered and concentrated to dryness by evaporation in vacuo at room temperature. 41.7 g of a crystalline yellow compound of formula:

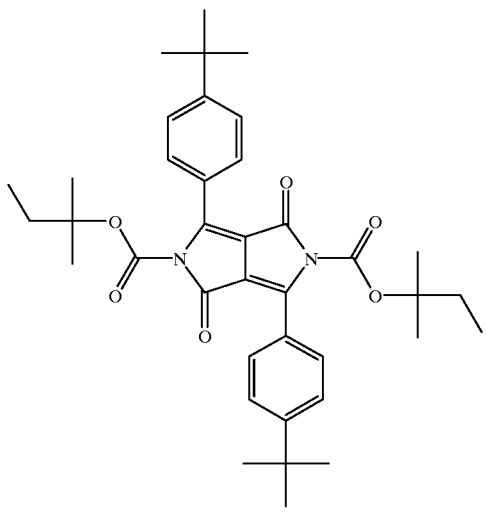

are obtained.

Analysis [%]: calc. C, 72.58; H, 7.69; N, 4.45; ($C_{38}H_{48}N_2O_6$) found C, 72.46; H, 7.70; N, 4.43.

EXAMPLE 7

A mixture of 45.9 g of C.I. Pigment Yellow 109, 3.42 g of dimethylaminopyridine and 38.2 g of di-tert-butyl dicarbonate in 1000 ml of THF is stirred at 23° C. for 24 hours, a further 7.6 g of di-tert-butyl dicarbonate being added after 4 hours and again after 8 hours. The clear, orange reaction mixture is concentrated to dryness by evaporation in vacuo. The moist residue is taken up in 70 ml of methanol, filtered and concentrated to dryness by evaporation in vacuo at room temperature. 47.9 g of a crystalline yellow compound of formula:

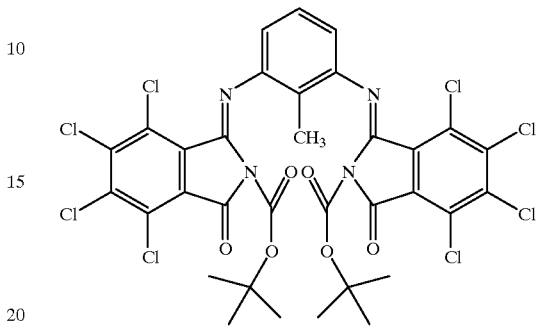

are obtained.

Analysis [%]: calc. C, 46.29; H, 2.83; N, 6.54; Cl, 33.13; ($C_{33}H_{24}N_4O_6Cl_8$) found C, 46.80; H, 2.99; N, 6.56; Cl, 31.49.

EXAMPLE 8

A solution of 52.52 g of methyl iodide in 100 ml of dry diethyl ether is added dropwise to a suspension of 9.0 g of magnesium turnings in 50 ml of dry diethyl ether. After 1½ hours at reflux, a solution of 30 g of (2-methoxy-ethoxy)-ethyl acetate in 150 ml of diethyl ether is added dropwise, the temperature of the reaction mixture being maintained at 25° C. by external cooling with ice-water. After one hour at 25° C., the mixture is cooled to 10° C., 75 ml of diethyl ether are then added, and 135 ml of 10% hydrochloric acid are subsequently added dropwise at 10–15° C. The organic phase is washed with 100 ml of saturated $NaHCO_3$ solution and 100 ml of $H_2O$, dried with $MgSO_4$, filtered through a small amount of kieselguhr and concentrated by evaporation. 22.6 g (82% of the theoretical yield) of the product of formula

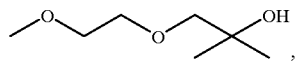

which boils at 90° C./0.8 mbar, are obtained.

$^1$H-NMR (CDCl$_3$, 300 MHz) δ: 3.33–3.38 (m,2H), 3.23–3.28 (m,2H), 3.07 (s,3H), 3.00 (s,2H), 2.68 (broad, 1H), 0.88 (s,6H).

The same product can also be prepared analogously to U.S. Pat. No. 2,886,600.

That product is reacted, analogously to known processes, with phosgene to form the product of formula

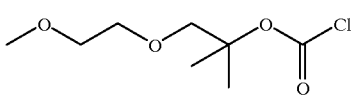

which is then reacted further with Pigment Yellow 109 in the presence of a deprotonating catalyst. The compound of formula

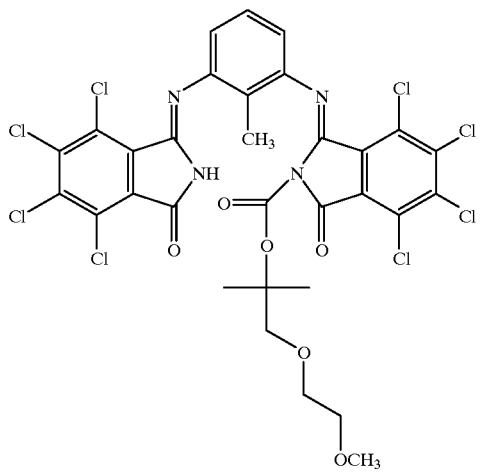

is obtained.

Analysis [%]: calc. C, 44.85; H, 2.67; N, 6.75; Cl, 34.16; ($C_{31}H_{22}N_4O_6Cl_8$) found C, 44.98; H, 2.87; N, 6.52; Cl, 32.39.

$^1$H-NMR (CDCl$_3$, 300 MHz) δ: 8.26 (s,1H), 7.16 (t,1H), 6.68 (d,1H), 76.49 (d,1H), 3.62 (m,2H), 3.51 (m,2H), 3.45 (s,2H), 3.34 (s,3H), 2.07 (s,3H), 1.27 (s,6H).

EXAMPLE 9

The procedure is analogous to that of Example 2 but di-tert-butyl dicarbonate is used instead of di-tert-amyl dicarbonate analogously to Example 7.

EXAMPLE 10

The procedure is analogous to that of Example 4 but di-tert-butyl dicarbonate is used instead of di-tert-amyl dicarbonate analogously to Example 7.

EXAMPLE 11

The procedure is analogous to that of Example 5 but di-tert-butyl dicarbonate is used instead of di-tert-amyl dicarbonate analogously to Example 7.

EXAMPLE 12

The procedure is analogous to that of Example 6 but di-tert-butyl dicarbonate is used instead of di-tert-amyl dicarbonate analogously to Example 7.

EXAMPLE 13

A formulation is prepared by dissolving 60 g of ™PHM-C resin (Maruka Lyncur, M$_w$=5300), 5 g of ™Cymel 300 (cyanamide), 40 g of ™Trisp-PA (Mitsui), 2.5 g of 2-(2-(4-methoxyphenyl)ethenyl)-4,6-bis(trichloromethyl)-1,3,5-triazine, 25 g of the solubilised pigment according to Example 9 and 15 g of the solubilised pigment according to Example 1 in 500 g of cyclopentanone.

A 2.2 μm thick film is obtained by spin-coating at a speed of 1000 rev/min onto a 7.5×7.5 cm glass plate (Corning type 7059) and subsequent drying on a hot-plate at 100° C. for 1 minute.

The film is exposed image-wise through a mask by means of a ™UXM-502 MD lamp (500 watts, Ushio) for 1 minute, and then heated at 100° C. for 1 minute on a hot-plate. Developing is then carried for 30 seconds in a developer solution consisting of 2.38% by weight tetramethylammonium hydroxide and 2% by weight ™FC430 (3M) dissolved in water, the previously exposed areas of the film remaining behind whilst the unexposed areas are dissolved away. Finally, the structured glass plate is heated at 220° C. for 2 minutes on a hot-plate. Patterned film structures of a deep blue colour are obtained.

The transmission spectrum of the blue film has a maximum (T=70%) at 450 nm and a minimum (T=4%) at 600 nm with steep edges at 580 and 620 nm.

EXAMPLE 14

Analogously to Example 13, 60 g of ™PHM-C resin, 40 g of ™Trisp-PA and 2.5 g of 2-(2-(4-methoxyphenyl)ethenyl)-4,6-bis(trichloromethyl)-1,3,5-triazine, but 5 g of ™Cymel 300, 50 g of the solubilised pigment according to Example 4, 7.5 g of the solubilised pigment according to Example 7 and 400 g of cyclopentanone are used.

Spin-coating and subsequent drying analogously to Example 13 yield a 3.4 μm thick film. The film is subsequently exposed and heated analogously to Example 13 and then developed for 3 minutes, the previously unexposed areas of the film being dissolved away whilst the exposed areas remain behind. The glass plate is then heated in a heating cabinet from 140° C. to 200° C. at a heating rate of 10° C./min, and then for 5 mn at 200° C., resulting in patterned film structures of a deep red colour.

If, instead of the solubilised pigments according to Examples 4 and 7, there is used the C.I. Pigment Red 177 solubilised according to Example 7 of EP 654 711, patterned brownish red film structures are produced, the transmission spectrum of which exhibits a smooth increase from 530 to 650 nm.

EXAMPLE 15

Analogously to Example 14, 40 g of ™PHM-C resin, 20 g of ™Trisp-PA, 5 g of ™Cymel 300, 2.5 g of 2-(2-(4-methoxyphenyl)ethenyl)-4,6-bis(trichloromethyl)-1,3,5-triazine, 25 g of the solubilised pigment according to Example 1 and 25 g of the solubilised pigment according to Example 7 are dissolved in 400 g of cyclopentanone.

Spin-coating and subsequent drying analogously to Example 13 yield a film of from 1.7 to 1.8 μm thickness. That film is then exposed analogously to Example 13, but for 2 minutes, heated for 2 minutes at 100° C. and finally developed for 30 seconds, with only the previously unexposed areas of the film being dissolved away. The glass plate is then heated on a hot-plate for 1 minute at 200° C. resulting in patterned film structures of a deep green colour.

EXAMPLE 16

A formulation is prepared by dissolving 1.0 g of a copolymer prepared from methacrylic acid and benzyl methacrylate by radical polymerisation (1% AIBN, toluene, 20 hours at 70° C., M$_n$=8500, M$_w$=35000), 0.7 g of dipentaerythritol monohydroxypentaacrylate (™SR 399, Sartomer Inc.), 0.1 g of the product according to Example 2, 0.1 g of the product according to Example 1 and 0.1 g of ®Irgacure 369 (Ciba Specialty Chemicals Inc.) in 7 g of cyclopentanone.

The formulation is then spin-coated onto a glass plate at 1000 rev/min, exposed for 100 seconds analogously to Application Example 13, heated for 2 minutes at 100° C. and finally developed for 30 seconds, the previously unexposed areas of the film being dissolved away whilst the exposed areas remain behind. The glass plate is then heated on a hot-plate for 1 minute at 230° C. resulting in patterned blue film structures.

EXAMPLE 17

Analogously to Example 16, a formulation is prepared by dissolving 1.0 g of a copolymer prepared from methacrylic acid and benzyl methacrylate by radical polymerisation (1% AIBN, toluene, 20 hours at 70° C., $M_n$=8500, $M_w$ 35000), 0.7 g of dipentaerythritol monohydroxypentaacrylate (™SR 399, Sartomer Inc.), 0.2 g of the product according to Example 4, 0.02 g of the product according to Example 7 and 0.1 g of ®Irgacure 369 (Ciba Specialty Chemicals Inc.) in 7 g of cyclopentanone.

The formulation is then spin-coated onto a glass plate at 1000 rev/min, exposed for 100 seconds analogously to Application Example 16, heated for 2 minutes at 100° C. and finally developed for 50 seconds, the previously unexposed areas of the film being dissolved away whilst the exposed areas remain behind. The glass plate is then heated on a hot-plate for 1 minute at 230° C. resulting in patterned red film structures.

EXAMPLE 18

A formulation is prepared by dissolving 1.0 g of a copolymer prepared from methacrylic acid and benzyl methacrylate by radical polymerisation (1% AIBN, toluene, 20 hours at 70° C., $M_n$=8500, $M_w$ 35000), 0.7 g of dipentaerythritol monohydroxypenta-acrylate (™SR 399, Sartomer Inc.), 0.1 g of the product according to Example 1, 0.1 g of the product according to Example 7 and 0.1 g of ®Irgacure 369 (Ciba Specialty Chemicals Inc.) in 7 g of cyclopentanone.

The formulation is then spin-coated onto a glass plate at 1000 rev/min, exposed for 100 seconds analogously to Application Example 16, heated for 2 minutes at 100° C. and finally developed for 30 seconds, the previously unexposed areas of the film being dissolved away whilst the exposed areas remain behind. The glass plate is then heated on a hot-plate for 1 minute at 230° C. resulting in patterned green film structures.

EXAMPLE 19

A formulation is prepared by dissolving 1.20 g of ™PHM-C resin ($MD_w$=5300, Maruka Lyncur), 0.40 g of ™Cymel 300 (cyanamide), 0.80 g of Trisp-PA (Mitsui), 0.1 g of 2-(2-(4-methoxyphenyl)ethenyl)-4,6-bis (trichloromethyl)-1,3,5-triazine, 0.35 g of the product according to Example 5 and 0.45 g of the product according to Example 6 in 8 g of cyclopentanone. The solution is filtered through Hyflo before use.

A 2.6 μm thick film is obtained by spin-coating onto a 7.5×7.5 cm glass plate (Corning type 7059) at a speed of 700 rev/min and subsequent drying on a hot-plate at 100° C. for 1 minute.

The film is exposed image-wise through a mask using a ™UXM-502 MD lamp (500 watts, Ushio) for 2 minutes, and then heated on a hot-plate for 1 minute at 100° C. Developing is then carried out for 30 seconds in a developer solution consisting of 2.38% by weight tetramethylammonium hydroxide and 2% by weight ™FC430 (3M) dissolved in water, the previously exposed areas of the film remaining behind whilst the unexposed areas are dissolved away. Finally, the structured glass plate is heated on a hot-plate for 2 minutes at 235° C. Patterned deep red film structures are obtained.

EXAMPLE 20

Analogously to Example 14, 60 g of ™PHM-C resin, 40 g of ™Trisp-PA, 10 g of ™Cymel 300 and 2.5 g of 2-(2-(4-methoxyphenyl)ethenyl)-4,6-bis(trichloromethyl)-1,3,5-triazine, but 24 g of the solubilised pigment according to Example 8 and 34 g of the solubilised pigment according to Example 10, are dissolved in 400 g of cyclopentanone. The further processing is carried out according to Example 14. The colour coordinates of the red film reflect its high colour saturation (x=0.633, y=0.340).

EXAMPLE 21

Analogously to Example 15, 60 g of ™PHM-C resin, 40 g of ™Trisp-PA, 10 g of ™Cymel 300 and 2.5 g of 2-(2-(4-methoxyphenyl)ethenyl)-4,6-bis(trichloromethyl)-1,3,5-triazine, but 28 g of the solubilised pigment according to Example 1 and 85 g of the solubilised pigment according to Example 8, are dissolved in 500 g of cyclopentanone. The further processing is carried out according to Example 15. The colour coordinates of the green film reflect its high colour saturation (x=0.311, y=0.584).

What is claimed is:

1. A structured pigmented high molecular weight organic material comprising a single-colored layer which comprises pigment particles of an average particle size of 0.1 μm or less and is obtainable from a radiation-sensitive precursor by irradiation,
wherein
   the organic material comprises at least 5% by weight pigment particles, based on the pigmented material;
   at least 80 mol % of the pigment particles consist of two components (a) and (b), wherein
      (a) is selected from the group consisting of mirror-symmetrical or point-symmetrical diketopyrrolopyrrole, dioxazine, isoindoline, isoindolinone and bisacetylacetamidarylene-group-containing disazo pigments, each containing at least one —NHCO— group, and
      (b) is selected from the group consisting of diketopyrrolopyrrole, dioxazine, isoindoline, isoindolinone, benzimidazolonazo and disazo pigments, each containing at least one —NHCO— group, and phthalocyanine pigments,
      wherein
      component (b) may be present in no more than an equimolar ratio to component (a),
      when the molecule of component (a) is mirror-symmetrical, component (b) must be present in a molar ratio to component (a) of from 1:5 to 1:1, and
      when the molecule of component (a) is point-symmetrical, component (b) must be present in a molar ratio to component (a) of from 3:7 to 1:1;

and when less than 100 mol % of the pigment particles consist of components (a) and (b), the balance of up to 20 mol % consists of one or more components (c).

2. A pigmented material according to claim 1, wherein component (a) is a pigment selected from the group of

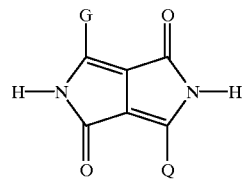
(I)

wherein G and Q are each independently of the other a group of formula

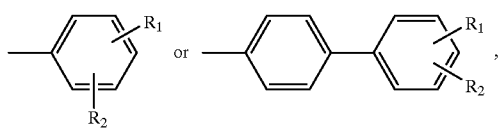

and $R_1$ and $R_2$ are each independently of the other hydrogen, halogen, cyano, carbamoyl, nitro, trifluoromethyl, phenyl, $C_1$–$C_6$alkyl, $C_1$–$C_6$alkoxy, $C_1$–$C_6$alkylthio or $C_1$–$C_6$alkylamino;

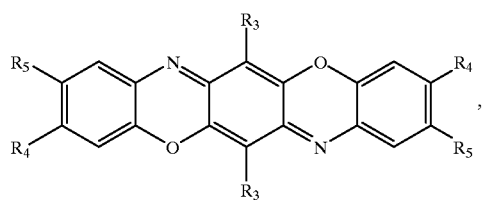
(II)

wherein $R_3$, $R_4$ and $R_5$ are each independently of the others hydrogen, halogen, $C_1$–$C_4$alkyl, $C_1$–$C_4$alkoxy, NHCO$C_1$–$C_4$alkyl or NHCOphenyl, at least 1 of the radicals $R_3$, $R_4$ and $R_5$ being NHCO$C_1$–$C_4$alkyl or NHCOphenyl;

isoindolines of formula

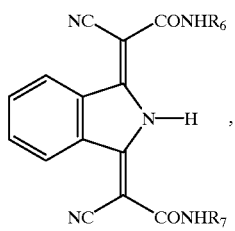
(III)

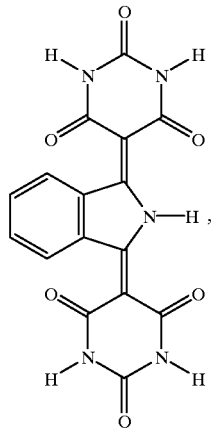
(V)

wherein $R_6$ is a group

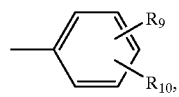

$R_7$ is hydrogen, $C_1$–$C_6$alkyl, benzyl or a group

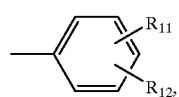

and $R_9$, $R_{10}$, $R_{11}$ and $R_{12}$ are each independently of the others hydrogen, $C_1$–$C_6$alkyl, $C_1$–$C_6$alkoxy, halogen or trifluoromethyl;

isoindolinones of formula

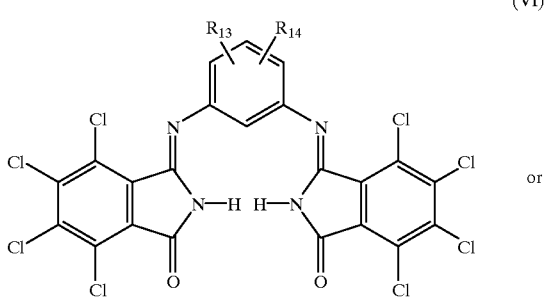
(VI)

or

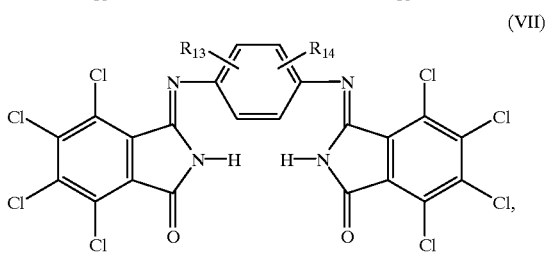
(VII)

wherein $R_{13}$ and $R_{14}$ are each independently of the other hydrogen, halogen or $C_1$–$C_6$alkyl; and disazos of formula

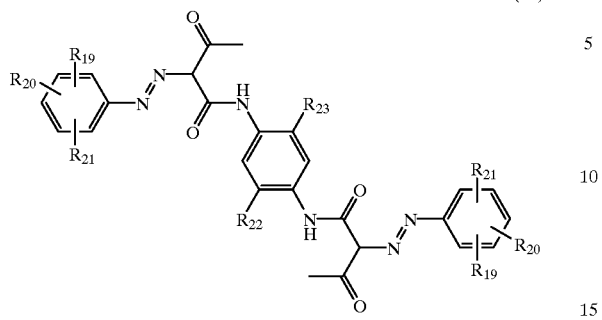
(IX)

where $R_{19}$, $R_{20}$ and $R_{21}$ are each independently of the others hydrogen, halogen, nitro, $C_1$–$C_6$alkoxy, $C_1$–$C_6$alkyl, trifluoromethyl, $CONHR_{24}$ or $SO_2NHR_{24}$, and $R_{22}$ and $R_{23}$ are each hydrogen, halogen, nitro, $C_1$–$C_6$alkoxy or $C_1$–$C_6$alkyl, and $R_{24}$ is hydrogen, halogen, $C_1$–$C_4$alkyl; or phenyl, naphthyl, biphenyl or oxybisphenyl each unsubstituted or substituted by from 1 to 3 substituents selected from the group consisting of halogen, nitro, trifluoromethyl, $C_1$–$C_4$alkoxy and $C_1$–$C_4$alkyl.

3. A pigmented material according to claim 2, comprising as component (a) or (b) or as additional component (c) a pigment selected from the group of pyrrolo[3,4-c]pyrroles of formula

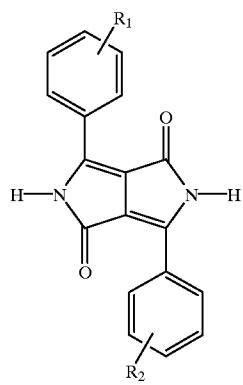
(XII)

wherein $R_1$ and $R_2$ are each independently of the other hydrogen, halogen, cyano, carbamoyl, nitro, trifluoromethyl, phenyl, $C_1$–$C_6$alkyl or $C_1$–$C_6$alkoxy;

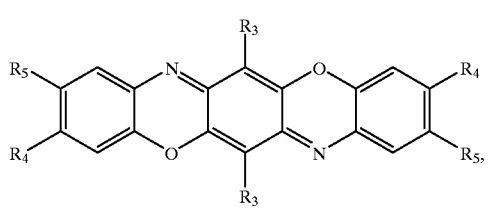
(II)

wherein $R_3$, $R_4$ and $R_5$ are each independently of the others $C_1$–$C_4$alkoxy, $NHCOC_1$–$C_4$alkyl or NHCOphenyl, at least 1 of the radicals $R_3$, $R_4$ and $R_5$ being $NHCOC_1$–$C_4$alkyl or NHCO-phenyl;

the isoindoline of formula

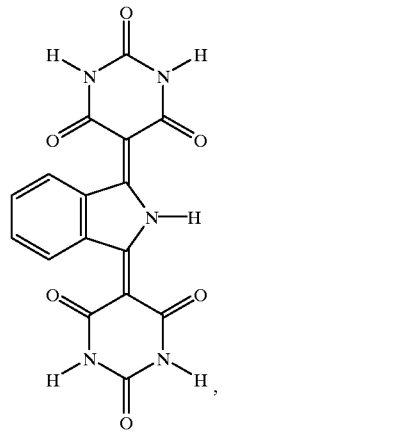
(XIII)

isoindolinones of formula

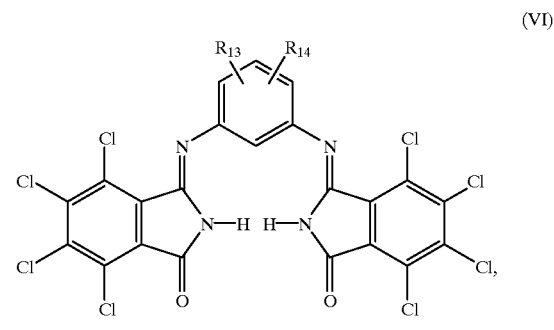
(VI)

wherein $R_{13}$ and $R_{14}$ are each independently of the other hydrogen, halogen or $C_1$–$C_4$alkyl;

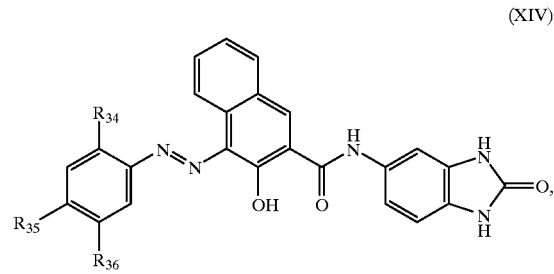
(XIV)

disazos of formulae

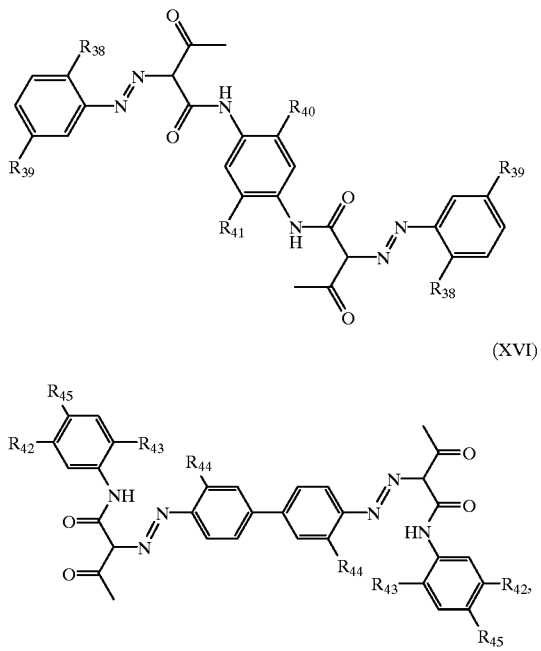

wherein $R_{38}$ and $R_{39}$ are each independently of the other hydrogen, chlorine, $CONHR_{46}$ or $SO_2NHR_{46}$,
$R_{40}$ and $R_{41}$ are each hydrogen, chlorine or methyl,
$R_{42}$, $R_{45}$ and $R_{43}$ are each independently of the others hydrogen, chlorine, methyl or methoxy,
$R_{44}$ is chlorine, methyl or methoxy and
$R_{46}$ is phenyl or oxybisphenyl each unsubstituted or substituted by from 1 to 3 substituents selected from the group consisting of chlorine, trifluoromethyl, methoxy and methyl;
or comprising as component (b))or as additional component (c) phthalocyanines of formula

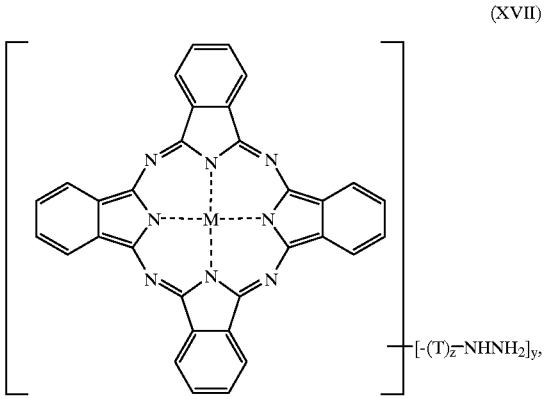

wherein M is $H_2$, a divalent metal selected from the group consisting of Cu(II), Zn(II), Fe(II) and Ni(II), T is —CO— or —SO$_2$— and y is a number from 1 to 4; and where appropriate, phthalocyanine derivatives obtained from phthalocyanines of formula (XVII) as a result of thermal or photochemical decomposition.

4. A pigmented material according to claim 3, wherein the pigment contained as component (a) or b or as additional component (c) is a pigment of formula (XV).

5. A pigmented material according to claim 3 wherein $R_{38}$ is chlorine and $R_{39}$ is $CONHR_{46}$ and $R_{46}$ is phenyl or oxybisphenyl each substituted by 2 substituents selected from the group consisting of chlorine, trifluoromethyl and methyl.

6. A pigmented material according to claim 5 wherein $R_{44}$ is chlorine.

7. A pigmented material according to claim 1 containing at least 10% by weight pigment particles, based on the pigmented high molecular weight material.

8. A pigmented material according to claim 1, wherein at least 90 mol % of the pigment particles consist of two components (a) and (b).

9. A pigmented material according to claim 1, which is coated onto a transparent substrate as a thin layer having a thickness of $\leq 20$ µm.

10. A pigmented material according to claim 1, wherein the material is red, blue or green.

11. A transparent substrate onto which there are coated in any sequence a red, a blue and a green thin layer of a pigmented material according to claim 1, the different coloured layers being in such a pattern that each of the red, blue and green layers does not overlap with a layer of a different colour on at least 5% of its area.

12. A method of altering the spectrum of a visible light beam in the form of radiation comprising the selective absorption of a portion of the radiation by means of a coloured medium using a coloured medium that comprises a transparent substrate coated with a pigmented high molecular weight organic material according to claim 1.

13. A method of producing colour filters, which comprises coating a transparent substrate with a radiation-sensitive precursor containing a material according to claim 1 and structuring said coated substrate by means of irradiation through a mask.

14. A pigmented material according to claim 1, wherein substantially all the pigment particles consist of pigments selected from the group consisting of
pyrrolo[3,4-c]pyrroles of formula

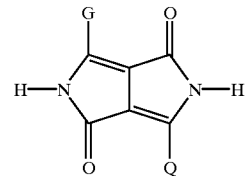

wherein G and Q are each independently of the other a group of formula

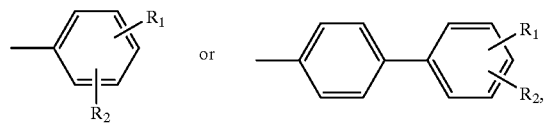

and $R_1$ and $R_2$ are each independently of the other hydrogen, halogen, cyano, carbamoyl, nitro, trifluoromethyl, phenyl, $C_1$–$C_6$alkyl, $C_1$–$C_6$alkoxy, $C_1$–$C_6$alkylthio or $C_1$–$C_6$alkylamino;

dioxazines of formula

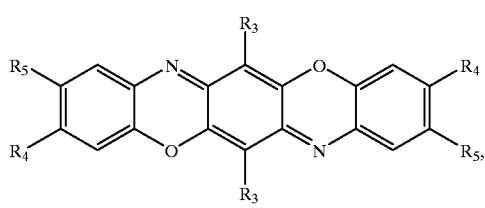
(II)

wherein $R_3$, $R_4$ and $R_5$ are each independently of the others hydrogen, halogen, $C_1$–$C_4$alkyl, $C_1$–$C_4$alkoxy, NHCOC$_1$–C$_4$alkyl or NHCOphenyl, at least 1 of the radicals $R_3$, $R_4$ and $R_5$ being NHCOC$_1$–C$_4$alkyl or NHCOphenyl;

isoindolines of formula

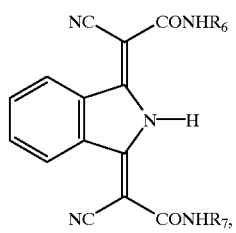
(III)

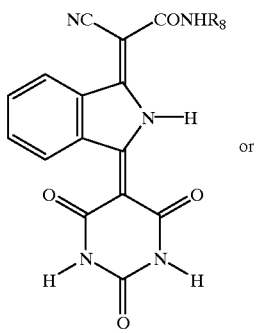
(IV)
or

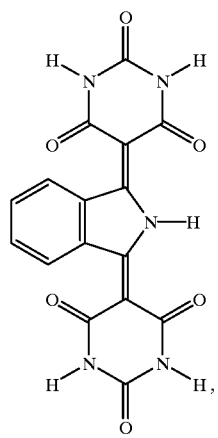
(V)

wherein $R_6$ is a group

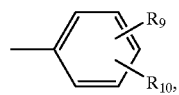

$R_7$ is hydrogen, $C_1$–$C_6$alkyl, benzyl or a group

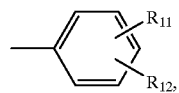

$R_8$ is hydrogen or $R_6$, and
$R_9$, $R_{10}$, $R_{11}$ and $R_{12}$ are each independently of the others hydrogen, $C_1$–$C_6$alkyl, $C_1$–$C_6$alkoxy, halogen or trifluoromethyl;

isoindolinones of formula

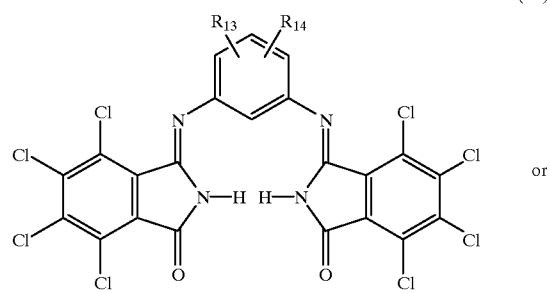
(VI)
or

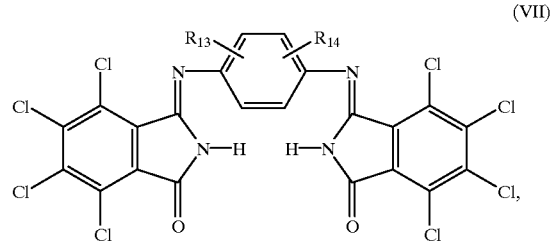
(VII)

wherein $R_{13}$ and $R_{14}$ are each independently of the other hydrogen, halogen or $C_1$–$C_6$alkyl;

benzimidazolonazos of formula

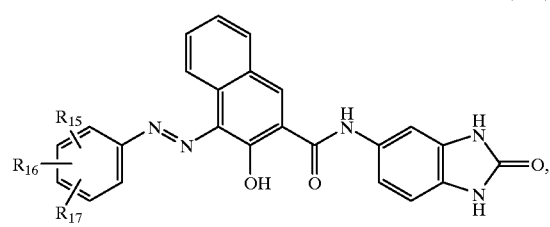
(VIII)

wherein $R_{15}$, $R_{16}$ and $R_{17}$ are each independently of the others hydrogen, halogen, $C_1$–$C_6$alkoxy, $C_1$–$C_6$alkyl, trifluoromethyl, CONHR$_{18}$ or SO$_2$NHR$_{18}$, and
$R_{18}$ is hydrogen, halogen, $C_1$–$C_4$alkyl, or phenyl unsubstituted or substituted by hydrogen, halogen, nitro, $C_1$–$C_4$alkoxy or by $C_1$–$C_4$alkyl; and disazos of formula

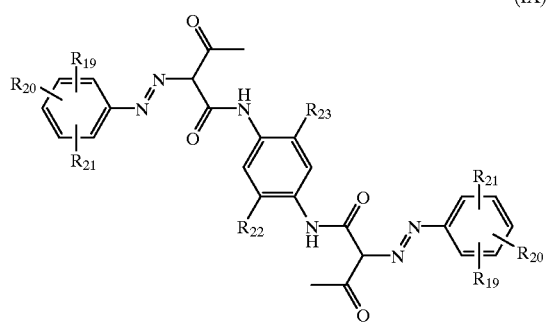

(IX)

where $R_{19}$, $R_{20}$ and $R_{21}$ are each independently of the others hydrogen, halogen, nitro, $C_1$–$C_6$alkoxy, $C_1$–$C_6$alkyl, trifluoromethyl, $CONHR_{24}$ or $SO_2NHR_{24}$, and $R_{22}$ and $R_{23}$ are each hydrogen, halogen, nitro, $C_1$–$C_6$alkoxy or $C_1$–$C_6$alkyl, and $R_{24}$ is hydrogen, halogen, $C_1$–$C_4$alkyl; or phenyl, naphthyl, biphenyl or oxybisphenyl each unsubstituted or substituted by from 1 to 3 substituents selected from the group consisting of halogen, nitro, trifluoromethyl, $C_1$–$C_4$alkoxy and $C_1$–$C_4$alkyl.

* * * * *